(12) United States Patent
Farmer et al.

(10) Patent No.: US 9,494,738 B1
(45) Date of Patent: Nov. 15, 2016

(54) SINGLE MODE FIBER COMBINERS

(75) Inventors: Jason N. Farmer, Vancouver, WA (US); Robert G. Waarts, Los Altos, CA (US); John Edgecumbe, Madison, CT (US)

(73) Assignee: nLIGHT, Inc., Vancouver, WA (US)

( * ) Notice: Subject to any disclaimer, the term of this patent is extended or adjusted under 35 U.S.C. 154(b) by 316 days.

(21) Appl. No.: 12/474,210

(22) Filed: May 28, 2009

(51) Int. Cl.
| | |
|---|---|
| *G02B 6/26* | (2006.01) |
| *G02B 6/42* | (2006.01) |
| *G02B 6/122* | (2006.01) |
| *G02B 6/28* | (2006.01) |

(52) U.S. Cl.
CPC .......... *G02B 6/1228* (2013.01); *G02B 6/2835* (2013.01)

(58) Field of Classification Search
CPC .... G02B 6/14; G02B 6/2551; G02B 6/2552; G02B 6/021; G02B 6/02009; G02B 6/1228; G02B 6/12195; G02B 6/02042
See application file for complete search history.

(56) References Cited

U.S. PATENT DOCUMENTS

| | | |
|---|---|---|
| 3,505,046 A | 4/1970 | Phaneuf |
| 4,046,537 A | 9/1977 | Deserno et al. |
| 4,072,399 A | 2/1978 | Love |
| 4,087,159 A | 5/1978 | Ulrich |
| 4,179,185 A | 12/1979 | Hawk |
| 4,773,924 A | 9/1988 | Berkey |
| 4,818,062 A | 4/1989 | Scifres et al. |
| 4,871,487 A | 10/1989 | Laursen |
| 5,011,251 A | 4/1991 | Miller et al. |
| 5,017,206 A | 5/1991 | Miller et al. |
| 5,153,932 A | 10/1992 | Blyler, Jr. et al. |
| 5,239,176 A | 8/1993 | Stevenson |
| 5,259,046 A | 11/1993 | DiGiovanni et al. |
| 5,295,210 A * | 3/1994 | Nolan et al. ................... 385/43 |
| 5,295,211 A | 3/1994 | Weidman |
| 5,305,414 A | 4/1994 | Higby et al. |
| 5,408,554 A | 4/1995 | Cryan et al. |
| 5,448,673 A | 9/1995 | Murphy et al. |
| 5,461,692 A | 10/1995 | Nagel |
| 5,568,318 A | 10/1996 | Leger et al. |
| 5,579,422 A | 11/1996 | Head et al. |
| 5,629,997 A | 5/1997 | Hardy |
| 5,664,037 A | 9/1997 | Weidman |

(Continued)

FOREIGN PATENT DOCUMENTS

| | | |
|---|---|---|
| RU | 2176840 C2 | 12/2001 |
| WO | WO 92/10014 | 6/1992 |

(Continued)

OTHER PUBLICATIONS

Eidam et al., "Femtosecond fiber CPA system emitting 830 W average output power," Opt. Lett. 35:94-96 (2010).

(Continued)

*Primary Examiner* — Ryan Lepisto
*Assistant Examiner* — Erin Chiem
(74) *Attorney, Agent, or Firm* — Klarquist Sparkman, LLP

(57) ABSTRACT

Single mode fiber beam combiners are formed by extending single mode fibers through a glass ferrule, and tapering and fusing the fibers and the ferrule. Tapers can be selected so that optical power input to each of the single mode fibers remains partially guided by the single mode fiber cladding, or is guided by the multimode fiber formed by the glass ferrule and the fused fiber claddings. Such combiners can include double clad fibers or actively doped fibers for use in lasers or amplifiers.

33 Claims, 25 Drawing Sheets

(56) References Cited

U.S. PATENT DOCUMENTS

| | | |
|---|---|---|
| 5,668,903 A | 9/1997 | Neuberger et al. |
| 5,715,270 A | 2/1998 | Zediker |
| 5,729,643 A | 3/1998 | Hmelar et al. |
| 5,734,766 A | 3/1998 | Flint |
| 5,745,284 A | 4/1998 | Goldberg et al. |
| 5,818,630 A | 10/1998 | Fermann et al. |
| 5,825,803 A | 10/1998 | Labranche |
| 5,864,644 A * | 1/1999 | DiGiovanni et al. ........... 385/43 |
| 5,867,305 A | 2/1999 | Waarts et al. |
| 5,873,923 A | 2/1999 | DiGiovanni |
| 5,887,097 A | 3/1999 | Henry et al. |
| 5,935,288 A | 8/1999 | DiGiovanni et al. |
| 5,949,932 A | 9/1999 | Lawrenz-Stolz |
| 6,031,953 A | 2/2000 | Rekow et al. |
| 6,044,096 A | 3/2000 | Wolak et al. |
| 6,078,716 A * | 6/2000 | Huang et al. ................. 385/126 |
| 6,101,199 A | 8/2000 | Wang et al. |
| 6,134,362 A | 10/2000 | Au-Yeung et al. |
| 6,198,858 B1 | 3/2001 | Pan et al. |
| 6,272,268 B1 | 8/2001 | Miller et al. |
| 6,278,816 B1 | 8/2001 | Keur et al. |
| 6,292,608 B1 | 9/2001 | Toh |
| 6,373,868 B1 | 4/2002 | Zhang |
| 6,385,371 B1 | 5/2002 | Li |
| 6,397,636 B1 | 6/2002 | DiGiovanni et al. |
| 6,404,954 B1 | 6/2002 | Zhu et al. |
| 6,421,489 B1 | 7/2002 | Berkey et al. |
| 6,434,295 B1 | 8/2002 | MacCormack et al. |
| 6,434,302 B1 | 8/2002 | Fidric et al. |
| 6,477,295 B1 | 11/2002 | Lang et al. |
| 6,496,301 B1 | 12/2002 | Koplow et al. |
| 6,516,124 B2 | 2/2003 | Po |
| 6,532,244 B1 | 3/2003 | Dewey et al. |
| 6,608,951 B1 | 8/2003 | Goldberg et al. |
| 6,666,590 B2 | 12/2003 | Brosnan |
| 6,668,112 B1 | 12/2003 | Kaneda |
| 6,700,709 B1 | 3/2004 | Fermann |
| 6,731,837 B2 | 5/2004 | Goldberg et al. |
| 6,778,732 B1 | 8/2004 | Fermann |
| 6,816,652 B1 | 11/2004 | Lin et al. |
| 6,868,236 B2 | 3/2005 | Wiltsey et al. |
| 6,907,163 B2 | 6/2005 | Lewis |
| 6,956,876 B1 | 10/2005 | Aquaro et al. |
| 6,970,624 B2 | 11/2005 | DiGiovanni et al. |
| 6,990,278 B2 | 1/2006 | Vakili et al. |
| 7,016,573 B2 | 3/2006 | Dong et al. |
| 7,046,432 B2 | 5/2006 | Starodoumov |
| 7,046,875 B2 | 5/2006 | Gonthier et al. |
| 7,209,615 B2 | 4/2007 | Fishteyn |
| 7,221,822 B2 | 5/2007 | Grudinin et al. |
| 7,236,671 B2 | 6/2007 | Rasmussen |
| 7,272,956 B1 | 9/2007 | Anikitchev et al. |
| 7,327,920 B2 | 2/2008 | Dong et al. |
| 7,336,872 B1 | 2/2008 | Malo |
| 7,343,074 B1 | 3/2008 | Gallagher et al. |
| 7,420,996 B2 | 9/2008 | Schulte et al. |
| 7,436,868 B2 | 10/2008 | Schulte et al. |
| 7,437,046 B2 | 10/2008 | DiGiovanni et al. |
| 7,443,895 B2 | 10/2008 | Schulte et al. |
| 7,526,165 B2 | 4/2009 | Nielsen et al. |
| 7,532,792 B2 | 5/2009 | Skovgaard et al. |
| 7,539,377 B2 | 5/2009 | Gonthier |
| 7,561,769 B2 | 7/2009 | Fujimoto et al. |
| 7,574,087 B2 | 8/2009 | Inoue et al. |
| 7,586,963 B2 | 9/2009 | Schulte et al. |
| 7,606,452 B2 | 10/2009 | Bilodeau et al. |
| 7,637,126 B2 | 12/2009 | Koeppler et al. |
| 7,729,574 B2 | 6/2010 | Moriarty |
| 7,746,545 B2 | 6/2010 | Okuno |
| 7,760,978 B2 | 7/2010 | DiGiovanni et al. |
| 7,787,733 B2 | 8/2010 | DiGiovanni et al. |
| 7,957,432 B2 | 6/2011 | Seo et al. |
| 7,991,255 B2 | 8/2011 | Salokatve |
| 8,068,705 B2 | 11/2011 | Gapontsev et al. |
| 8,213,070 B2 | 7/2012 | Koplow |
| 8,248,688 B2 | 8/2012 | Baird et al. |
| 8,346,038 B2 | 1/2013 | Gonthier |
| 8,433,168 B2 | 4/2013 | Filippov et al. |
| RE44,262 E | 6/2013 | Gonthier et al. |
| 8,457,456 B2 | 6/2013 | Kopp et al. |
| 8,472,765 B2 | 6/2013 | Holland |
| 8,483,533 B1 | 7/2013 | Mehl |
| 8,498,046 B2 | 7/2013 | Dong et al. |
| 8,711,471 B2 | 4/2014 | Liu et al. |
| 2002/0172486 A1 | 11/2002 | Fermann |
| 2003/0021530 A1 | 1/2003 | Li |
| 2003/0031442 A1 | 2/2003 | Siegman |
| 2004/0228593 A1 | 11/2004 | Sun et al. |
| 2005/0008044 A1 | 1/2005 | Fermann et al. |
| 2005/0041702 A1 | 2/2005 | Fermann et al. |
| 2005/0226286 A1 | 10/2005 | Liu et al. |
| 2005/0265653 A1 | 12/2005 | Cai et al. |
| 2005/0265678 A1 | 12/2005 | Manyam et al. |
| 2005/0276556 A1 | 12/2005 | Williams et al. |
| 2006/0215976 A1 | 9/2006 | Singh et al. |
| 2007/0062222 A1 | 3/2007 | Janka et al. |
| 2007/0086501 A1 | 4/2007 | Karlsen |
| 2007/0116071 A1 | 5/2007 | Schulte et al. |
| 2007/0116077 A1 | 5/2007 | Farmer et al. |
| 2007/0196062 A1 | 8/2007 | Inoue et al. |
| 2007/0237453 A1 * | 10/2007 | Nielsen et al. ................. 385/28 |
| 2007/0266738 A1 | 11/2007 | Gallagher et al. |
| 2007/0280597 A1 | 12/2007 | Nakai et al. |
| 2008/0050069 A1 * | 2/2008 | Skovgaard et al. ............ 385/39 |
| 2008/0063348 A1 | 3/2008 | Kumano et al. |
| 2008/0118213 A1 | 5/2008 | Andrieu et al. |
| 2008/0166094 A1 | 7/2008 | Bookbinder et al. |
| 2008/0170823 A1 | 7/2008 | Gonthier |
| 2008/0205840 A1 | 8/2008 | Wakabayashi et al. |
| 2009/0003788 A1 | 1/2009 | Galvanauskas |
| 2009/0010286 A1 | 1/2009 | Messaddeq et al. |
| 2009/0052840 A1 | 2/2009 | Kojima et al. |
| 2009/0060417 A1 * | 3/2009 | Bilodeau et al. ............... 385/43 |
| 2009/0092365 A1 | 4/2009 | Donlagic |
| 2009/0136176 A1 | 5/2009 | Kopp et al. |
| 2009/0202204 A1 * | 8/2009 | Nielsen et al. ................. 385/43 |
| 2010/0111118 A1 * | 5/2010 | Seo et al. ........................ 372/6 |
| 2010/0142894 A1 | 6/2010 | Gonthier |
| 2010/0247047 A1 | 9/2010 | Filippov et al. |
| 2010/0278486 A1 * | 11/2010 | Holland et al. ................. 385/43 |
| 2011/0032602 A1 | 2/2011 | Rothenberg |
| 2011/0032603 A1 | 2/2011 | Rothenberg |
| 2011/0032604 A1 | 2/2011 | Rothenberg et al. |
| 2011/0058250 A1 | 3/2011 | Liu et al. |
| 2011/0069723 A1 | 3/2011 | Dong et al. |
| 2011/0100066 A1 | 5/2011 | Bohme et al. |
| 2011/0157671 A1 | 6/2011 | Koplow |
| 2011/0305250 A1 | 12/2011 | Chann et al. |
| 2012/0127563 A1 | 5/2012 | Farmer et al. |
| 2012/0219026 A1 | 8/2012 | Saracco et al. |
| 2012/0230352 A1 | 9/2012 | Minelly et al. |
| 2012/0260781 A1 | 10/2012 | Price et al. |
| 2013/0287338 A1 | 10/2013 | Majid et al. |
| 2014/0119694 A1 | 5/2014 | Abedin et al. |

FOREIGN PATENT DOCUMENTS

| | | |
|---|---|---|
| WO | WO 97/42533 | 11/1997 |
| WO | WO 2005/022705 | 3/2005 |
| WO | WO 2009/043968 | 4/2009 |
| WO | WO 2011/066440 | 6/2011 |
| WO | WO 2013/102033 | 7/2013 |

OTHER PUBLICATIONS

Geshiro et al., "Truncated parabolic-index fiber with minimum mode dispersion," IEEE Transaction on Microwave Theory and Technology, 26(2):115-119, 1978.

Geshiro et al., "Analysis of wave modes in slab waveguide with truncate parabolic index," IEEE Jouranl of Quantum Electronics, 10(9):647-649, 1974.

International Search Report from International Application No. PCT/US2012/072003, dated Apr. 4, 2013, 2 pp.

(56) References Cited

OTHER PUBLICATIONS

International Search Report from International Application No. PCT/US2013/030569, dated Jul. 4, 2013, 3 pp.

Niels Asger Mortensen, "Air-clad fibers: pump absorption assisted by chaotic wave dynamics?," Optics Express, vol. 15, No. 14, Jul. 9, 2007 (published Jul. 5, 2007).

nLIGHT Corporation, "nLIGHT Introduces New Line of All Fiber Mode Field Tapers" Jan. 23, 2009 News Release, http://nlight.net/new/releases/92~nLIGHT-Introduces-New-Line-of-All-Fiber-Mode-Field, downloaded Jan. 18, 2014.

nLIGHT, spreadsheet listing Order dates for tapers.

Russbueldt et al., "400 W Yb:YAG Innoslab fs-amplifier," Optics Express, vol. 17(15):12230-12245 (2009).

Stolzenburg et al., "Picosecond Regenerative Yb:YAG Thin Disk Amplifier at 200 kHz Repetition Rate and 62 W Output Power," Advanced Solid-State Photonics, OSA Tech Digest, MA6 (2007).

Written Opinion from International Application No. PCT/US2013/030569, dated Jul. 4, 2013, 5 pp.

Written opinion from International Application No. PCT/US2012/072003, dated Apr. 4, 2013, 3 pp.

Jauregui et al., "All-fiber Side Pump Combiner for High Power Fiber Lasers and Amplifiers," Proc. of SPIE, 7580:75801E-1-75801E-8 (2010).

"Pump and Signal Taper for Airclad Fibers Final Report," Air Force Research Laboratory, 8 pages (May 1, 2006).

International Search Report from PCT Publication No. PCT/US2013/077242, 2pp. (dated May 22, 2014).

International Search Report from PCT Publication No. PCT/US2013/077243, 2pp. (dated Apr. 17, 2014).

Written Opinion from PCT Publication No. PCT/US2013/077242, 4pp. (dated May 22, 2014).

Written Opinion from PCT Publication No. PCT/US2013/077243, 4pp. (dated Apr. 17, 2014).

* cited by examiner

SINGLE MODE FIBER COMBINERS

FIELD

The disclosure pertains to single mode fiber beam combiners.

BACKGROUND AND SUMMARY

Fiber devices are convenient for generation and delivery of optical beams for numerous applications due to their small size and flexible beam delivery. To increase the available optical power for some applications, optical beams from two or more laser diodes are combined in a single fiber device. For example, some metal cutting applications require output powers of 2-100 kW or more from apertures of 50-100 µm in diameter. Typical fiber lasers are limited in output power to less than about 400-800 W and beams from multiple fiber lasers must be combined to achieve these power levels.

An example optical system for combining such beams is illustrated in FIG. 1. Fiber lasers outputs 101-104 deliver respective optical fluxes to collimating lenses 111-114 that produce collimated beams that are directed by a lens 115 to a common area 118 on an input surface 120 of an optical fiber 122 or other fiber or non-fiber optical device. As shown in FIG. 1, the lenses 111-114 are situated so that each of the optical beams is incident to the input surface 120 at a different angle of incidence. The optical fiber 122 must have a sufficiently large numerical aperture so as to receive the beams over these angles of incidence. Otherwise, the optical power directed into the fiber 122 is unlikely to be delivered to an output 124 of the fiber 122, thus diminishing the effectiveness of coupling the beams to the common area 118.

While the configuration of FIG. 1 can be used, it tends to pose significant mechanical alignment problems that can render beam output powers and beam output power distribution unstable. Typically, fibers used to receive overlapping beams as shown in FIG. 1 are multimode fibers having substantial numerical apertures and support propagation in a large number of optical modes. For such fibers, slight variations in coupling geometry associated with the fiber laser outputs 101-104, the lenses 111-114, the input surface 120, and the fiber 122 can produce variations in the available optical power at the fiber output and substantial variations in the distribution of optical power at the output 124. For applications that require constant, uniform, or otherwise well controlled powers and power distributions, these variations are unacceptable, and improved methods are needed.

While beams propagating in more than one single mode fiber can be combined by arranging the fibers in a bundle, such an arrangement does not provide a suitable combined beam. Optical fibers must have diameters of at least between 60-100 µm for mechanical strength so that a fiber bundle using such fibers would necessarily be larger than 50 µm. While combined beams delivered from such a bundle could be demagnified, demagnification produces unacceptable increases in beam numerical aperture.

Single mode beam combiners are disclosed herein that can produce superior optical powers and power distributions. In some disclosed examples, beam combiners comprise two or more single mode fibers, each having an input surface configured to receive a respective input optical beam. Each fiber has a core and a cladding along which the respective received optical beams propagate. In addition, each fiber includes a tapered portion, wherein the tapered portions of the two or more fibers are situated so as to define a bundled fiber portion having a combiner output surface. The tapered portions have tapers sufficient so that the input beams propagate in a lowest order mode at the fiber input surfaces but are either expanded in size while remaining guided by the cores or become unguided by the cores and guided in the multi-mode inner cladding formed by the fused cores of the input fibers. In the case of light guided by the inner cladding, the outer cladding may be formed by an air interface or alternatively by a lower index transparent material. In some embodiments, the input surfaces of the two or more single mode fibers are situated on flexibly separable fiber portions. In other examples, a tapered combiner cladding is in optical contact with and surrounds the bundled portion, the tapered combiner cladding having a refractive index that is less than a refractive index of the single mode fiber claddings. In other representative examples, the tapered portion of each of the single mode fibers is such that the bundled portion of the fibers and the combiner cladding form a multimode optical waveguide. In still other examples, a guide fiber has an input surface and extends to the combiner output surface, wherein the guide fiber is configured to deliver visible optical radiation to the output surface.

Illuminators comprise a plurality of single mode input optical fibers and a beam combiner having an input coupled to the input optical fibers and an output configured to deliver a combined beam. The beam combiner includes a plurality of tapered fiber portions corresponding to the single mode input optical fibers, wherein the tapered fiber portions are single mode waveguides or few mode waveguides that have waveguide modes corresponding to the input fiber modes at the coupling to the input fibers. Few mode waveguides typically are operated so as to have V-numbers of less than about 5. The tapered fiber portions are tapered so that the single waveguide modes expand to have mode field diameters that are at least twice the mode field diameter of the input optical fibers. An outer cladding may be situated about the tapered fiber portions so as to define a multimode waveguide in combination with the tapered fiber portions. Alternately, a waveguide may be formed by the air glass interface between the fused fibers and the surrounding air. In some examples, lasers such as diode lasers or fiber lasers are coupled to the single mode input fibers. In other examples, at least one of the tapered fiber portions is rare earth doped and is configured to receive pump radiation from other tapered fiber portions. In other embodiments, the single mode input fibers have mode field diameters of between about 5 µm and 15 µm, and the tapered fiber portions are tapered by at least a factor of two, five, or ten from an input to an output. In additional representative examples, an output multimode fiber is optically coupled to the tapered fiber portions. In some case the output from the tapered device may be coupled to pump a fiber laser. For example the output from an array of 1020 nm Yb-doped double clad fiber lasers may be combined to pump a Yb laser.

Optical amplifiers comprise a plurality of tapered pump fibers fused to a doped signal fiber and situated in an outer cladding. The pump fibers are single mode fibers tapered and fused so as to define a multimode core, and the signal fiber is a rare earth doped fiber operable to provide optical gain in response to pump radiation from the tapered pump fibers. In other examples, the multimode core defines a multimode fiber in combination with the outer cladding.

Tapered couplers comprise a plurality of tapered, fused single mode fibers enclosed in a glass ferrule or twisted around each other prior to fusing, the fibers tapered by a factor of at least 2. In some examples, at least one of the tapered single mode fibers includes at least a first core and a second core, and the second core defines a confined waveguide mode at a smaller end of the taper. In some embodiments, at least one of the tapered single mode fibers includes a core and a cladding, and at a smaller end of the taper, a waveguide mode extends to at least substantially all of a cladding cross-sectional area. In typical examples, the fibers are tapered by between a factor of 5 and 10.

Methods comprise inserting a plurality of single mode optical fibers through a glass ferrule and heating the fibers and the ferrule. The heated fibers and ferrule are stretched so as to fuse and taper the fibers and the ferrule to form a tapered bundle having an output surface. The single mode fibers are tapered so that that a multimode fiber is defined by the fused fibers and the ferrule or glass air interface. In other examples, at least one of the single mode fibers is a fiber having a first core and second core, and the second core defines a single mode waveguide after tapering. In further examples, the single mode fibers are tapered so that a mode defined by a fiber core expands to fill at least a tapered single mode fiber cladding.

Beam combiners comprise two or more few mode optical fibers having respective tapered portions that are situated so as to define a tapered fiber bundle. The tapered portions have tapers sufficient so that a mode field diameter of a lowest order mode associated with the few mode optical fibers is expanded by a factor of at least two. In some examples, the lowest order mode field diameter is expanded in the tapered portions to be substantially the same as a cladding diameter of the few mode optical fibers. In other examples, the tapered portions are configured so that a lowest order mode of each of the few mode optical fibers is substantially unguided by respective few mode optical fiber cores. In still other examples, the tapered portions are configured so that a lowest order mode of the few mode optical fibers is expanded so as to substantially occupy a cross-sectional area of the tapered fiber bundle. According to some examples, the few mode optical fibers have V-numbers of less than 5 or are single mode optical fibers. In some examples, input surfaces of the two or more few mode fibers are situated on flexibly separable fiber portions. In additional embodiments, a tapered combiner cladding is in optical contact with and surrounds the bundled portion, the tapered combiner cladding having a refractive index that is less than a refractive index of the few mode fiber claddings. In some examples, the tapered portions of each of the few mode fibers are fused to form the bundled portion so that the fused fibers and the combiner cladding form a multimode optical waveguide. According to some representative examples, the tapered portions are configured so that a lowest order mode of the few mode optical fibers is expanded so as to substantially fill a cross-section of the fused bundled portion.

In some examples, a tapered fiber bundle has an output surface, and a beam combiner further comprises a guide fiber extending through the bundled portion to the output surface. The guide fiber can be selected to permit the delivery of visible light to a work surface. In some examples, the beam combiner includes a single mode signal fiber having a corresponding tapered portion in the tapered fiber bundle, wherein the signal fiber is configured to be a few mode optical waveguide or a single mode optical waveguide in the tapered portion. In other embodiments, the beam combiner includes a double core fiber having a first core and a second core and having a tapered portion that is situated in the tapered fiber bundle, wherein the tapered second core defines a few mode fiber. Typically, the double core fiber is a most central fiber in the tapered fiber bundle. In some examples, the few mode fibers are double core fibers having a first core and a second core, wherein a most tapered portion of the tapered second core defines a few mode optical fiber. In additional examples, the beam combiner includes a signal fiber having a corresponding tapered portion in the tapered fiber bundle, wherein the signal fiber is configured to be a few mode optical fiber in the tapered portion.

Fiber assemblies comprise a beam combiner having a plurality of few mode input optical fibers that are fused and tapered to form a fiber bundle having an output surface. The few mode fibers are tapered so that optical beams received by the few mode input optical fibers are expanded by the tapering. An output fiber is optically coupled to the output surface of the beam combiner. In some examples, the output fiber is a double clad fiber having a core and an inner cladding, wherein the beam combiner is configured to optically couple the few mode input optical fibers and the inner cladding. In further examples, the beam combiner includes a signal fiber that is tapered in the fiber bundle so as to define a few mode fiber at the output surface, and is optically coupled to the core of the double clad fiber. In additional examples, a mode field diameter of a lowest order mode of the tapered signal fiber is substantially the same as a mode field diameter associated with the double clad fiber core. In other examples, the signal fiber is a double core fiber that is tapered in the fiber bundle so that a lowest order mode associated with a first core of the double core fiber expands so as to substantially fill a second core of the double core fiber. In still other examples, the few mode input optical fibers have claddings having refractive indices that are less than a refractive index of the outer cladding of the double core signal fiber so that the few mode optical fibers are optically coupled to the outer cladding. In some example, radiation sources are coupled to corresponding few mode input optical fibers. In some examples, the few mode fibers are single mode fibers.

Illuminators comprise a plurality of single mode input optical fibers and a beam combiner having an input coupled to the input optical fibers and an output configured to deliver a combined beam. The beam combiner includes a plurality of tapered fiber portions corresponding to the single mode input optical fibers, wherein the tapered fiber portions are single mode waveguides that have waveguide modes corresponding to the input fiber modes at the coupling to the input fibers. The tapered fiber portions are tapered so that the single waveguide modes expand to have mode field diameters that are at least twice the mode field diameter of the input optical fibers. In some examples, illuminators include an outer cladding situated about the tapered fiber portions so as to define a multimode waveguide in combination with the tapered fiber portions. In typical examples, laser diodes, fiber lasers, or other lasers are coupled to the single mode input fibers. In some examples, the single mode input fibers have mode field diameters of between about 5 μm and 15 μm, and the tapered fiber portions are tapered by at least a factor of between two and five from an input to an output. In other examples, an output multimode fiber is optically coupled to the tapered fiber portions.

Optical amplifiers comprise a plurality of tapered pump fibers fused to a single mode signal fiber to form a fiber bundle, wherein the pump fibers are single mode fibers tapered and fused so as to define a multimode core. A rare earth doped fiber is optically coupled to the fiber bundle, wherein the rare earth doped fiber is operable to provide optical gain in response to pump radiation from the tapered pump fibers. In some examples, an outer cladding has a refractive index that is less than a refractive index of pump fiber claddings.

Tapered couplers comprise a plurality of tapered, fused single mode fibers enclosed in a glass ferrule, the fibers tapered by a factor of at least 2. In some examples, at least one of the tapered single mode fibers includes at least a first core and a second core, and the second core defines a confined waveguide mode at a smaller end of the taper. In additional examples, at least one of the tapered single mode fibers includes a core and a cladding, and at a smaller end of the taper, a waveguide mode of the at least one tapered single mode fibers extends to at least substantially all of a cladding cross-section. In typical examples, the fibers are tapered by between a factor of 5 and 10.

The foregoing and other objects, features, and advantages of the technology will become more apparent from the following detailed description, which proceeds with reference to the accompanying figures.

DETAILED DESCRIPTION

Figure 1:
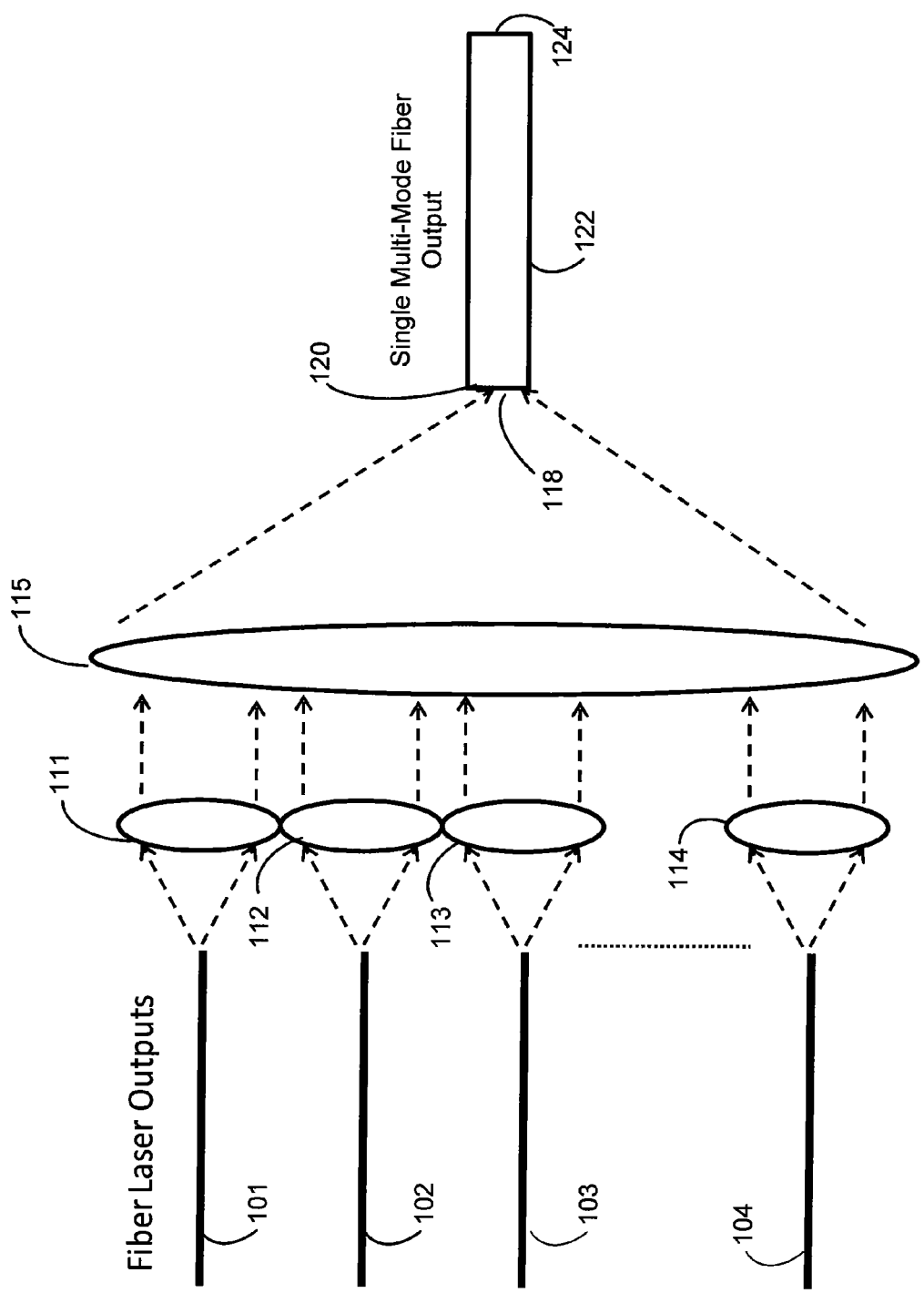
FIG. 1 is a schematic diagram of an optical system that includes a plurality of lenses situated to direct corresponding optical beams to an input surface of an optical fiber.

As used in this application and in the claims, the singular forms "a," "an," and "the" include the plural forms unless the context clearly dictates otherwise. Additionally, the term "includes" means "comprises."

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

Optical fibers or other optical waveguides are generally based on a variation of refractive index as a function of distance from a propagation axis. Such refractive index variations include so-called index steps such as those associated with typical step index fibers and continuous variations such as those associated with typical gradient index fibers. Many convenient examples are based on optical fibers having circular cross-sections. Such fibers generally include a central core that is surrounded by a cladding region and the core and cladding are selected to provide guided wave propagation. As described further below, some fibers include two or more cores or claddings.

In the disclosed examples, optical fibers or other waveguides or other optical elements or surfaces thereof are associated with inputs or outputs. It will be apparent that inputs and outputs can be reversed, depending on a particular application. In addition, the disclosed examples are typically described with reference to wavelengths between about 200 nm and 2000 nm, and typically between about 700 nm and 1600 nm, but other wavelengths and wavelength ranges can be used, and the disclosure is not limited to visible wavelengths. For purposes of this disclosure, a core of a single mode optical fiber waveguide is a portion of the fiber or waveguide that serves to guide optical radiation along a direction of propagation. A maximum radiation intensity occurs in the core for radiation propagating in the lowest order (single) mode. The described embodiments are typically based on fibers and other structures having circular cross-sections, but fibers and combiners can have circular, elliptical, oval, square, or polygonal or other cross-sectional areas or combinations of cross-sectional areas.

In the disclosed embodiments, combiners are formed by inserting a plurality of single mode optical fibers (without buffer coatings) into a glass ferrule and tapering and fusing the fibers and ferrule. In other examples, two or more fibers are formed into a bundle and then twisted and looped, and a twisted region of the fibers can be fused and tapered.

While single mode fibers are convenient, in some examples fibers that support a few modes are used and are referred to herein as "few mode" fibers. Such fibers have a normalized frequency parameter (V-number) defined as $V=(2\pi a/\lambda)(n_{core}^2-n_{clad}^2)^{1/2}$, wherein $\lambda$ is vacuum wavelength, a is a fiber core radius, and $n_{core}$, $n_{clad}$ are fiber core and fiber cladding refractive indices, respectively. A total number M of modes supported by a fiber is $M=4V^2/\pi^2$. For single mode fibers, V is less than about 2.405. As used herein, a few mode fiber is defined as a fiber for which a V-number is less than about 2.5, 3, 3.5, 4, 4.5, or 5.

In some examples, so-called double clad or double core fibers are used. A double clad fiber typically includes a core, an inner cladding, and an outer cladding. The core is typically selected to define a single mode (or few mode) waveguide, while the inner cladding defines a multimode core. Generally, a refractive index difference between the inner cladding and the outer cladding is relatively large so that a numerical aperture of the multimode waveguide defined by the inner and outer claddings can be large. A double core fiber typically includes a first (inner) core, a second (outer) core, and an outer cladding. The first core is selected to define a single mode (or few mode) waveguide prior to any tapering. The second core is selected to define a single mode (or few mode) waveguide after tapering. Generally refractive index differences between first core, second core, and outer cladding are relatively small.

In representative examples, two or more nearly diffraction limited optical beams produced by, for example, laser diodes, fiber lasers, other lasers, or combinations thereof are combined to produce a combined beam of comparable beam quality. Beam quality can be conveniently assessed based on a so-called beam parameter product (BPP) which is defined as a product of a beam radius measured at a beam waist and a beam divergence (angular radius) in a far field region. BPP is typically measured in units of mm-mrad, and smaller BPPs correspond to better beam quality. For a diffraction limited Gaussian beam, $BPP=\lambda/\pi$. For a beam having $\lambda=1064$ nm, the diffraction limited BPP is about 0.339 mm-mrad. Typical Yb-doped fiber lasers at wavelengths between about 1070 nm and 1090 nm produce beams with BPPs of about 0.4 mm-mrad. In some applications, combined beams in a 50 µm diameter aperture with a 0.1 numerical aperture, or a BPP of about 5 mm-mrad are advantageous. Because the BPP of typical laser sources is more than 10 times less than that required, such a beam combination is theoretically possible. The disclosed examples permit achieving BPPs that can approach BPP theoretical limits, but are not limited to devices that offer such performance.

Figure 2:
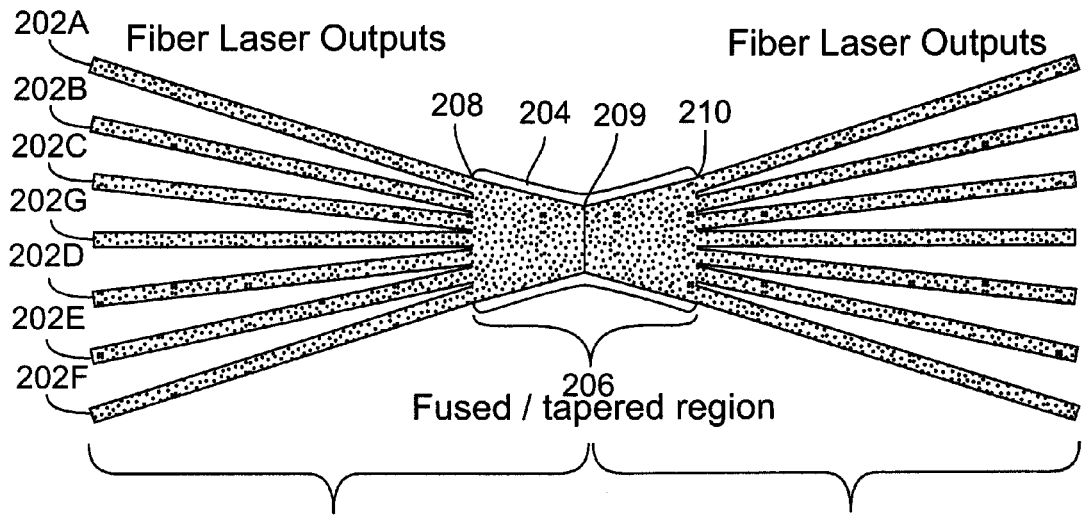
FIG. 2 illustrates single mode beam combiners prior to separation.

Typical beam combiners 200A-200B as manufactured are illustrated in FIG. 2. A plurality of optical fibers 202A-202G is surrounded by an optional outer cladding 204, typically a glass tube or ferrule. As shown in FIG. 2, the outer cladding 204 defines a tapered region 206 that extends from a first end 208 to a most tapered section 209 to a second end 210. As shown in FIG. 2, the taper from end 208 to the most tapered section 209 is substantially the same as the taper from the end 210 to the most tapered section 209, but asymmetric tapers can be provided. In addition, combinations of stepped and uniform tapers can be used. Typically, the fibers 202A-202G are single mode fibers and have cores of refractive index $n_1$, claddings of refractive index $n_2$, and the outer cladding 204 has a refractive index $n_3$, wherein $n_2<n_1$, and $n_3<n_2$. The fibers 202A-202G need not be all of the same type and can include combinations of various single mode and multimode fibers, double core fibers, actively doped fibers, and fibers designed for use in different wavelength ranges. The beam combiners 200A, 200B can be conveniently separated by cleaving or other processes.

A diameter or entrance aperture of the outer cladding 204 can be selected so that the fibers 202A-202G fit within the entrance aperture without substantial gaps between the fibers. Typically, the optical fibers 202A-202G substantially fill the entrance aperture 220. A beam combiner such as the beam combiner 200 can be conveniently fabricated by selecting a plurality of single mode optical fibers or other fibers, and inserting the fibers, preferably without any polymer or other protective coatings, into a glass tube that can serve as an outer cladding. The fibers may but need not extend through the glass tube. The glass tube and fibers are then heated so that the fibers and the surrounding glass tube can be drawn so as to taper. The amount and rate of taper can be selected as needed. Typically, sufficient taper is provided so that an output aperture at a smallest portion of a taper corresponds to an aperture size suitable for a particular application, or so that a suitable beam numerical aperture is achieved. As noted above, the taper can be selected to be asymmetric or symmetric.

The glass tube or other outer cladding can have round, square, elliptical, polygonal or other cross-sectional shapes. While a plurality of single mode fibers of a common design can be used, in other examples, various combinations of fibers can be used, including single mode fibers at different wavelengths, multimode fibers, double clad fibers, or combinations thereof. In some examples, other structures such as solid glass or metal rods or tubes can be inserted along with the fibers to provide additional mechanical strength or to provide an aperture through which the input and output ends are connected. In some examples, one or more of the fibers is a single mode fiber at a visible wavelength and can be used to provide a visible beam along with the infrared beams provided by other fibers. A visible beam can simplify alignment of the beam combiner with a target. In other examples, a multimode fiber is provided and is coupled to a detector or detection system at an input end of the beam combiner to aid in monitoring optical power reflected or scattered from a work surface.

Figure 3:
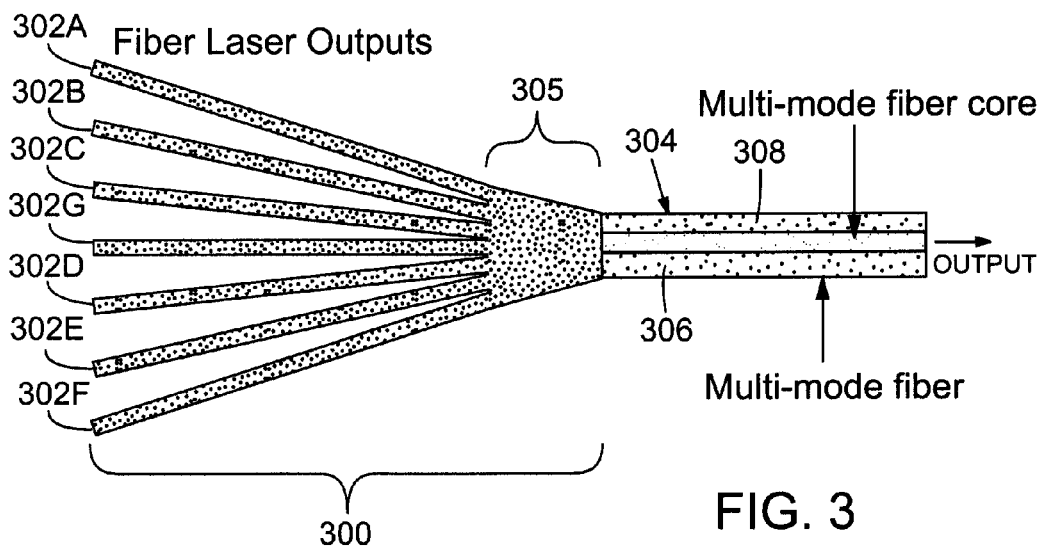
FIG. 3 illustrates a single mode beam combiner coupled to a multimode fiber.

FIG. 3 illustrates a beam combiner 300 arranged so as to combine optical radiation from fiber laser output fibers 302A-302G in a multimode fiber 304 having a core 306 and a cladding 308. In a tapered region 305, optical radiation from the fibers 302A-302G is combined so as to better match the diameter and numerical aperture of the multimode fiber 304 at a combiner output surface 305. The optical output from the beam combiner 300 can be directed to a target or target surface with bulk optical devices such as lenses and mirror instead of a fiber such as the fiber 304. In some applications, it is convenient to provide a common cross-sectional area of a common shape for the output surface 305 and the fiber 304. To provide mechanically robust assembly, the fiber 304 and the beam combiner 300 can be fused or glued together.

Figure 4:
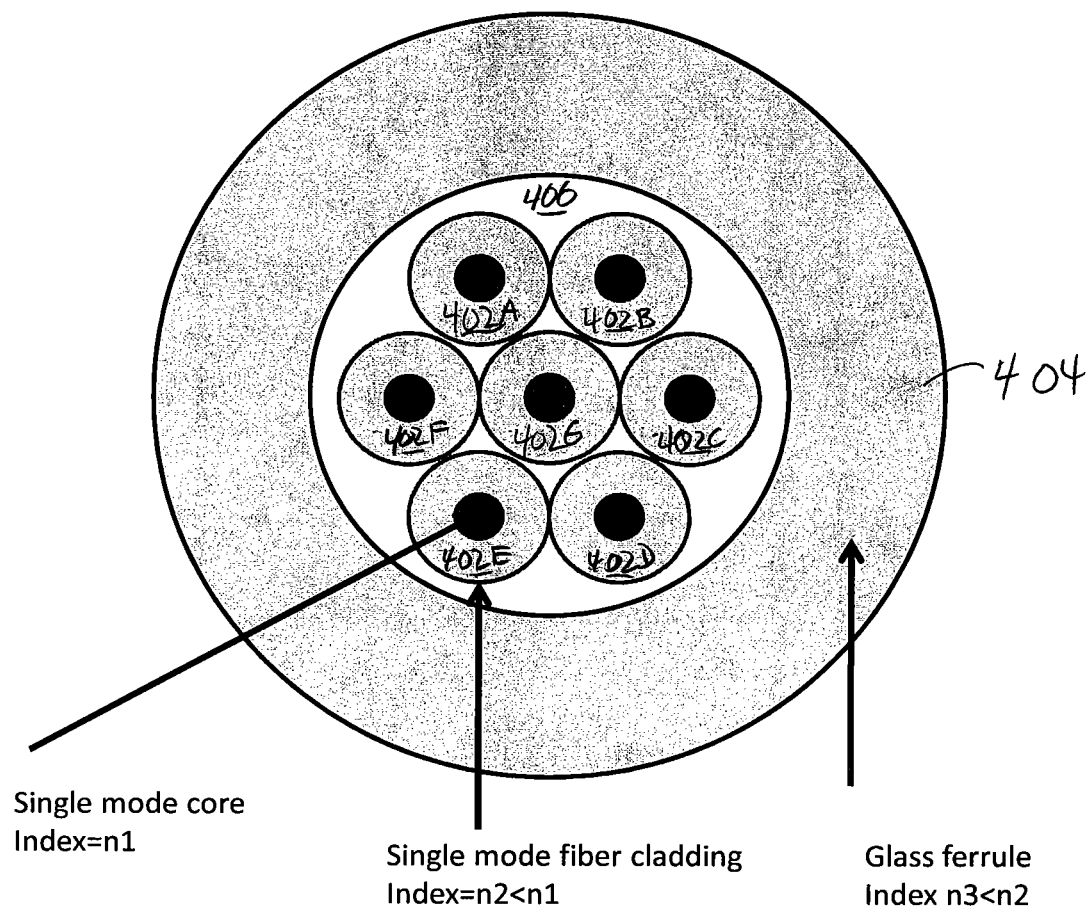
FIG. 4 is a sectional view of a plurality of optical fibers situated in a glass ferrule prior to fusing and tapering to form a beam combiner.
Figure 5:
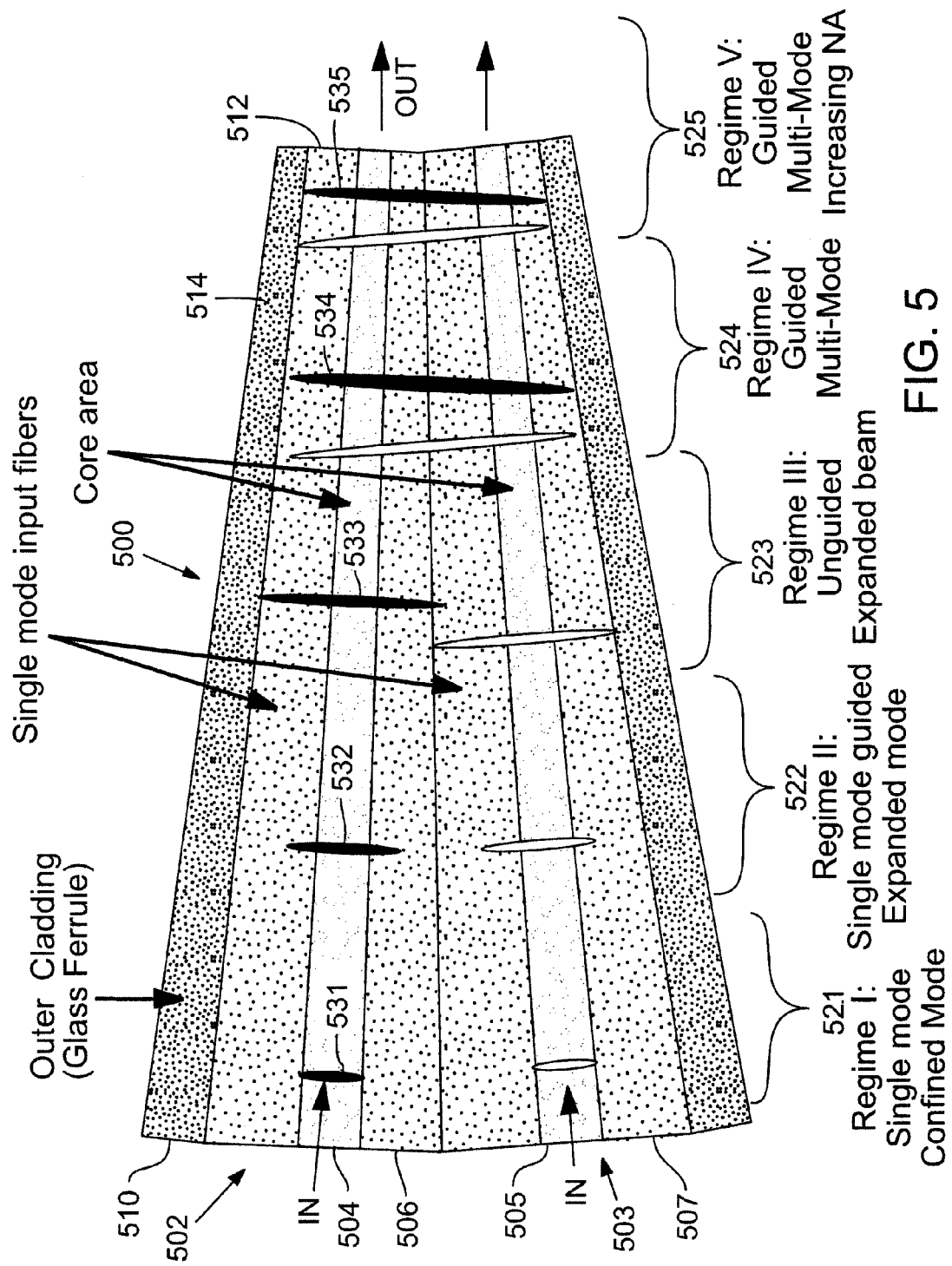
FIG. 5 illustrates mode size expansion in a tapered single mode beam combiner.

One convenient fabrication method for such beam combiners is illustrated in FIGS. 4-5. Fibers 402A-402G are inserted into or through a glass ferrule 404. A diameter, bore, or other aperture 406 of the ferrule 404 is selected so that the fibers 402 can be fitted within the ferrule 404 but substantially fill the aperture 406. Typically, the fibers 402A-402G are single mode fibers with cores of refractive index $n_1$, claddings of refractive index $n_2$, and the ferrule 404 has a refractive index $n_3$, wherein, $n_2 < n_1$, and $n_3 < n_2$. The glass ferrule 404 and the fibers 402A-402G are then heated and pulled so as to produce a tapered region and fuse the fibers 402A-402G. Typically, heating to a temperature of about 2000° C. is used, and can be accomplished with an electrical arc or a high temperature flame. Taper rates can be controlled based on a stretch rate provided by mechanical translation stages to which fiber portions are secured. Stretch rates, heating, and other process variables can be controlled using a computer-based controller. In some examples, fibers having 10 μm core diameters and 125 μm cladding diameters are tapered so to reduce core and cladding diameters to about 4 μm and 50 μm, respectively.

It will be appreciated that it is convenient to extend fibers through a ferrule to perform the fusing and tapering operations. Such a procedure produces two combiners (see, for example, FIG. 2) that can be separated by cleaving in the tapered region.

A representative portion of a tapered region 500 of such a combiner is illustrated in FIG. 5 after fusing and tapering. For convenient illustration, only two tapered fibers are shown, but more than two are used in many practical examples. Fibers 502, 503 include respective cores 504, 505 and claddings 506, 507 and are tapered so as to have decreasing cross-sectional areas from an input end 510 to an output end 512 of the tapered region 500. Typically, the claddings 506, 507 are in contact with each other. A glass ferrule 514 is in contact with one or more of the claddings and serves as an outer cladding of a multimode waveguide formed by fusion of the fibers 502, 502 and the ferrule 514. As shown in FIG. 5, an interior of the glass ferrule 514 is substantially filled by the fibers 502, 503.

The taper can be selected as follows. At the input end 510, beams propagating in the fibers 502, 503 are substantially confined in a lowest order mode and are substantially confined in the fiber cores 504, 505. Within the tapered glass ferrule 514, the fiber diameters taper as well. As the fiber cores taper, the lowest order mode associated with each of the fibers grows in diameter. In a confined region 521, each of the fibers continues to provide single mode propagation, typically with propagation characteristics that are established during fiber manufacture. In an expanded mode region 522, the fiber cores 504, 505 are sufficiently decreased in cross section so that the fiber mode diameter expands, but the fibers continue to serve as waveguides. In an unguided region 523, the fiber cores 504, 505 have sufficiently decreased in cross section so that the fiber modes are no longer confined by the single mode fiber core/cladding interfaces, and the beams are unguided or weakly guided by the fiber cores 504, 505. In a guided multi-mode region 524, the beams from the fibers 502, 503 have expanded so as to be confined by the outer cladding provided by the ferrule 514. In a tapered multimode region 525, the multimode waveguide defined by the tapered fibers 502, 503 and the ferrule 514 is further tapered to provide a selected numerical aperture or multi-mode fiber core diameter.

Expansion of beam diameter associated with decreasing core diameter is indicated schematically in FIG. 5. An initial guided mode in the fiber 502 has a mode cross-sectional area 531 that expands in the region 522 to a mode cross-sectional area 532. In the unguided region 523, the mode cross-sectional area 533 can expand so that in the guided multi-mode region 524, the mode cross-sectional area 534 fills the cross-sectional area defined by the ferrule 514. In the guided multimode region 525, a mode cross-sectional area 535 is shaped to provide a suitable numerical aperture. The mode of the fiber 503 (and any other fibers) are similarly transformed. In some examples, the fiber cores 504, 505 are rare earth doped to so as to provide optical gain when suitably pumped. In typical examples, a core diameter of a tapered region based on 7 single mode fibers is about 0.3 mm. Typically, tapers are used that decrease fiber diameters by factors of between about 2 and 4, and overall length of a tapered region is no greater than about 5-10 cm. Although the individual beams from the input fibers 502, 503 are shown as expanding to fill the aperture defined by the ferrule 514, in other examples, the single mode beams are expanded to overlap or substantially overlap each other without expanding sufficiently to fill this aperture.

While a fusion process is convenient, beam combiners can be formed by other processes. For example, a plurality of fibers can be tapered and fitted into a glass tube or other ferrule, and surrounded by an optically transmissive material of a suitable refractive index to serve as an outer cladding. Typically the tapered fibers should be in contact with each other, so that they are not separated (or not well separated) by the outer cladding material. If assembled in this manner, the ferrule need not be optically transmissive as it serves only to provide mechanical support. In some examples, the ferrule can be used during assembly and then removed. For example, an optical epoxy can be used as an outer cladding and cured within the ferrule. After curing is complete, the ferrule can be removed or left in place. It is generally preferable that any outer cladding material between fibers be thin or other spaces small enough so that fiber modes can expand in the tapered region.

Figure 6:
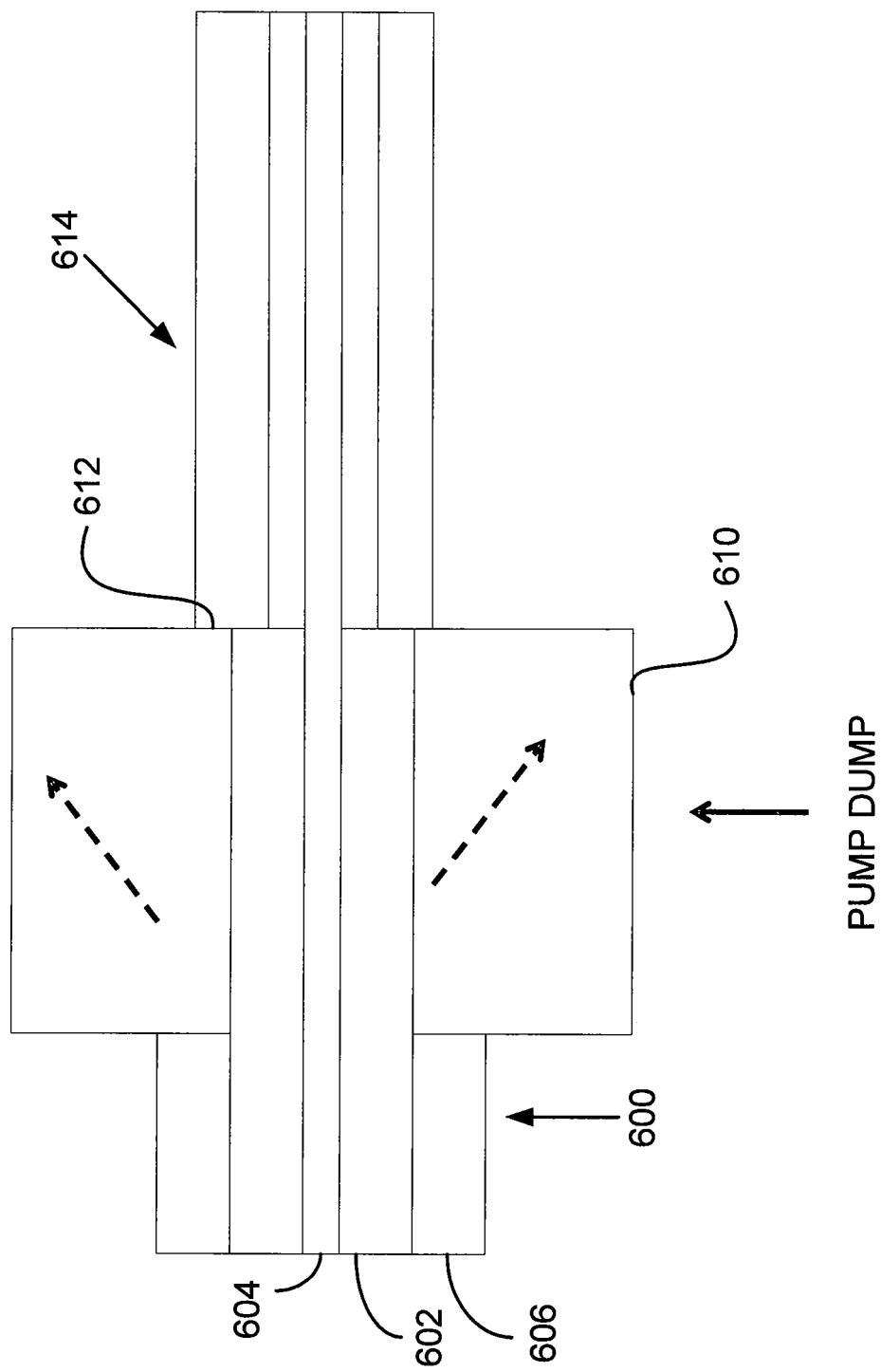
FIG. 6 illustrates a pumped double clad fiber coupled to a doped single mode fiber having a smaller overall diameter.

To provide convenient taper lengths, a large diameter fiber can be coupled to a smaller diameter fiber that is more suited to tapering to produce the mode field transformation of FIG. 5. Referring to FIG. 6, a double clad fiber 600 includes an interior cladding 602 and a single mode core 604 that are configured to provide single mode propagation in the core 604. The core 604 is doped to provide gain in response to pump radiation coupled from the interior cladding 602. The double clad fiber 600 also includes an exterior cladding 606 configured so that the first and second claddings define a multimode waveguide for pump radiation. A section 610 of an optically transmissive material that is approximately index matched to the first cladding 602 is in contact with the first cladding so that pump radiation is removed from the double clad fiber 600. The section 610 can be referred to as a "pump dump." At an exit surface 612, the double clad fiber 600 and a single mode fiber are fused. The single mode fiber 614 has a core 616 that has a mode field diameter similar to that associated with the single mode core 604 of the double clad fiber 600. The cladding diameter of the fiber 614 is smaller than the diameter of the double clad fiber 600 so that the amount of tapering needed in a beam combiner is reduced. For example, the fiber 614 can have a 100 μm diameter and the fiber 600 can have a 400 μm diameter, simplifying tapering by reducing the amount of taper required.

Figure 7:
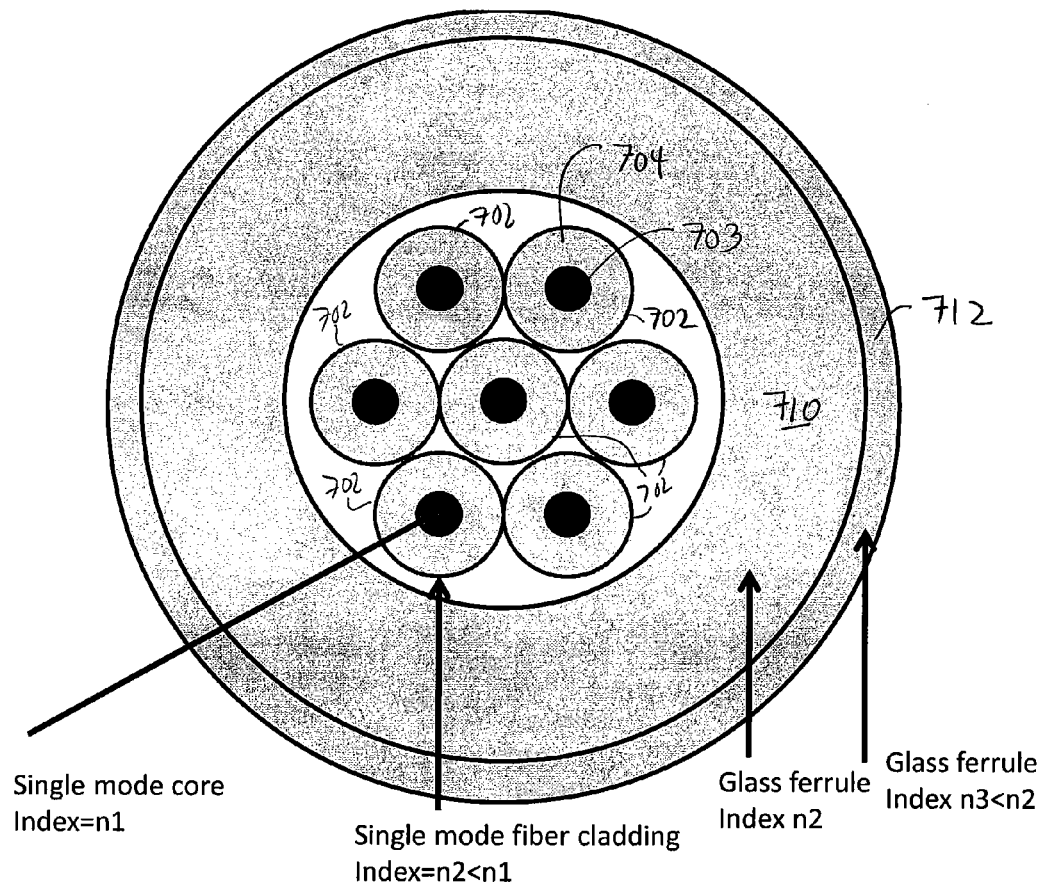
FIG. 7 illustrates a plurality of single mode fibers situated in a glass ferrule, wherein the cladding of the single mode fibers and the glass ferrule have a common refractive index.

With reference to FIG. 7, a tapered region of a fiber combiner includes single mode optical fibers 702 each having a core 703 and a cladding 704 with refractive indices $n_1$, $n_2$ respectively. The fibers 702 are captured by an inner ferrule 710 and an outer ferrule 712 which have refractive indices $n_2$, $n_3$ respectively, wherein $n_3 < n_2$. The fibers and ferrules are shown without the effects of tapering and fusing operations in FIG. 7 for convenience. Typically, after tapering and fusing, the fibers 702 are somewhat distorted and there are few or no voids between the fibers 702. In the example of FIG. 7, a multimode waveguide (the output waveguide) is defined by the inner and outer ferrules and has a larger core diameter than that defined only by the tapered cores of the single mode fibers 702. Thus, the configuration of FIG. 7 provides additional flexibility in selection of taper geometry and multimode output fiber core diameter and numerical aperture.

Figure 8:
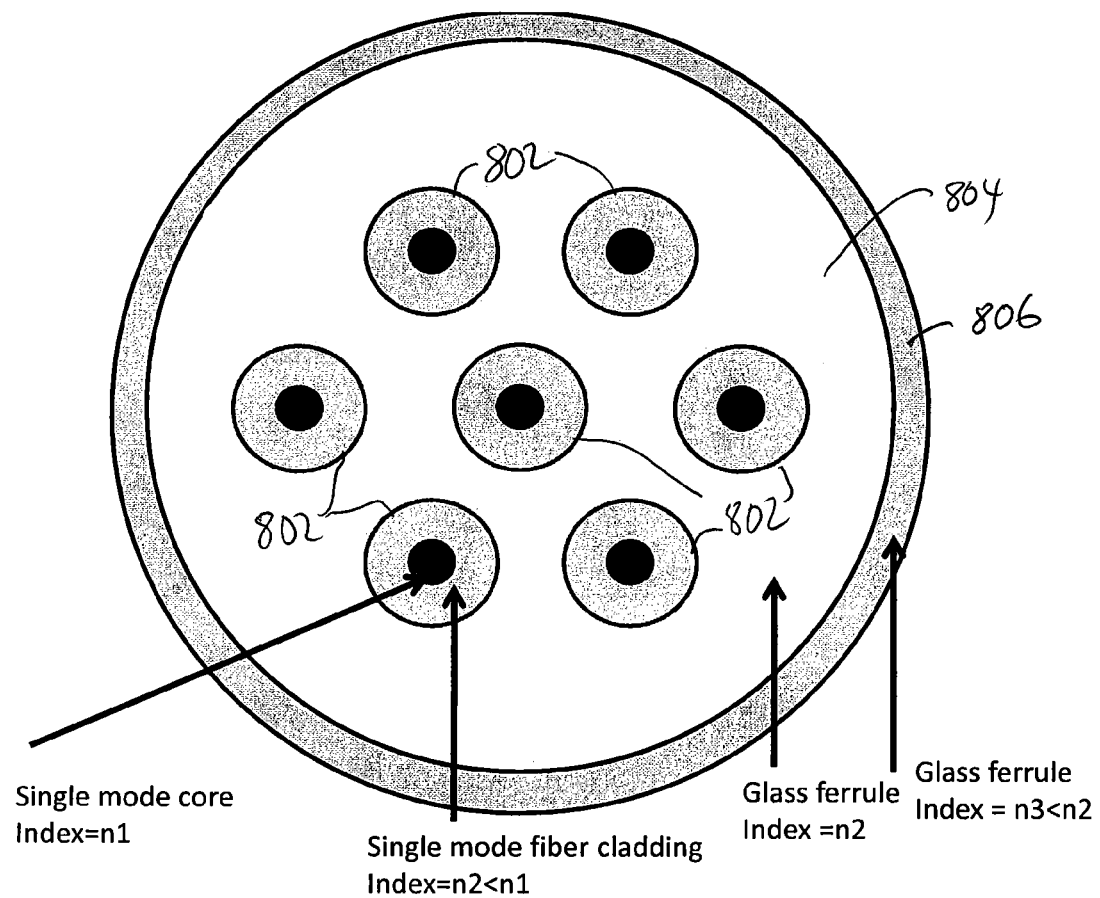
FIG. 8 illustrates a plurality of single mode fibers situated in a first glass ferrule, wherein the cladding of the single mode fibers has a refractive index that is similar to a refractive index of the first glass ferrule and a second glass ferrule where a refractive index of the second glass ferrule is less than the refractive index of the first ferrule.

FIG. 8 illustrates a portion of a tapered region of another example combiner that provides similar design flexibility. Single mode fibers 802 are embedded in an inner cladding 804 that is surrounded by an outer cladding 806 so that an output multimode fiber is defined by the inner cladding 804 which serves as a core for the output multimode fiber and the outer cladding which serves as the cladding for the output multimode fiber. Cores and claddings of the fibers 802 have refractive indices $n_1$, $n_2$ respectively, and the inner cladding 804 and the outer cladding 806 have refractive indices $n_2$, $n_3$, respectively, wherein $n_3 < n_2$.

Figure 9:
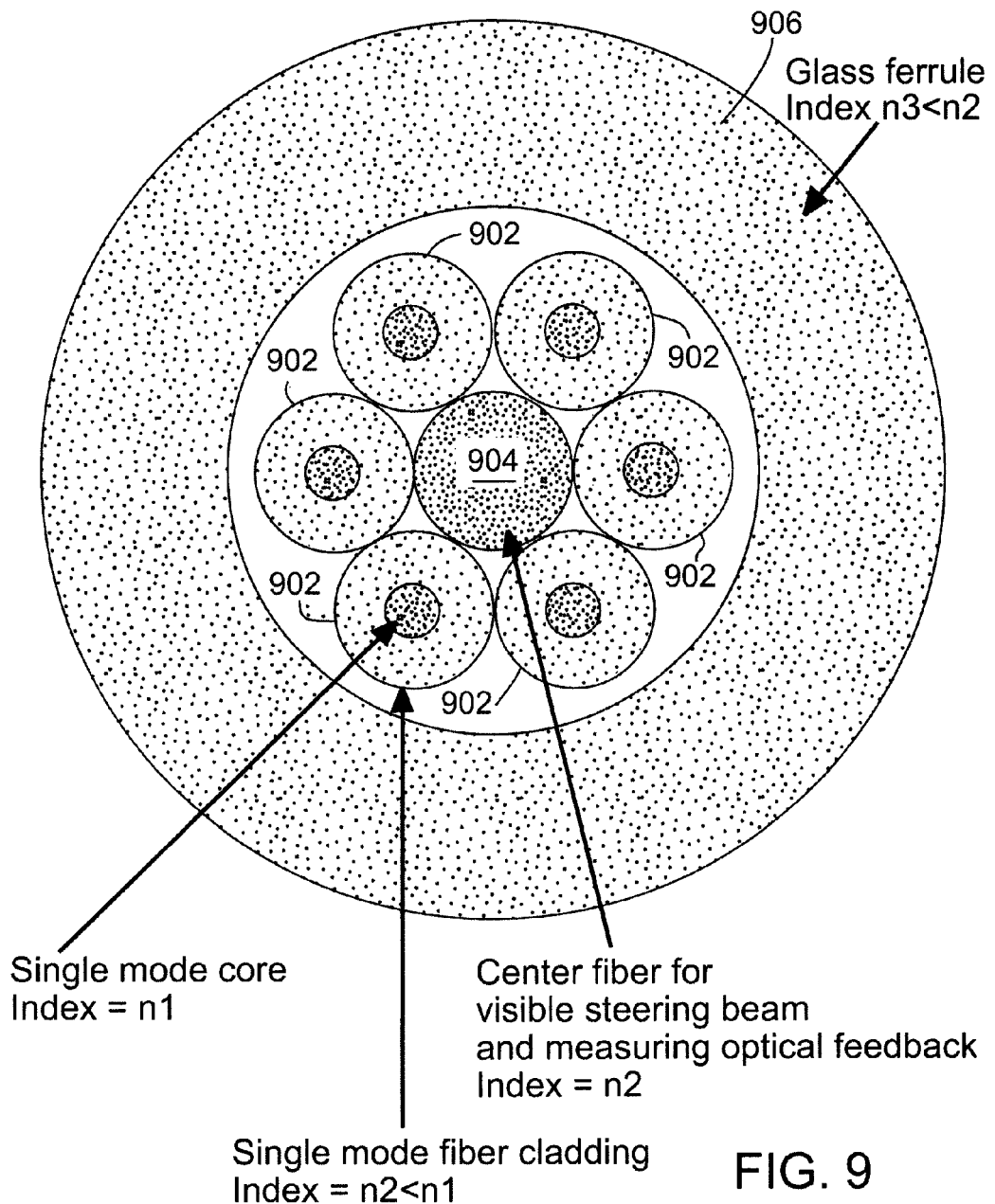
FIG. 9 illustrates a plurality of single mode fibers situated in a glass ferrule, wherein a central fiber is provided for beam steering and optical feedback from a work surface.

FIG. 9 illustrates a portion of a tapered region of another example combiner that includes single mode fibers 902 and a central beam steering fiber 904 that are surrounded by an outer cladding 906. (The effects of fusing the fibers 902, 904 is not shown for more convenient illustration.) The single mode fibers 902 are selected to deliver optical power for a particular application, and the central fiber 904 is configured to deliver visible optical power to a workpiece to aid in alignment or focusing of a work beam. The central fiber 904 can also serve to relay optical radiation scattered or reflected by a workpiece back to a detection system to permit evaluation and control of workpiece processing. Cores and claddings of the fibers 902 have refractive indices $n_1$, $n_2$, respectively, wherein $n_2 < n_1$, and the outer cladding 906 has a refractive index $n_3$, wherein $n_3 < n_2$. A central fiber refractive index equal to that of the single mode fiber claddings and the outer cladding 906 can permit feedback or steering radiation to propagate throughout the core of the multimode output fiber formed by the fused single mode fibers and the glass ferrule 906. Such feedback radiation can be directed to a detection system that can indicate that reflected power levels are too high or too low for a particular application, so that the detection system can signal to one or more of the input optical power sources that power to one or more of the fibers 902 is to be adjusted. In some examples, optical damage in a beam combiner can be avoided by suitable monitoring and feedback control of power levels. A feedback/steering fiber need not be centrally located, and the configuration of FIG. 9 is merely one example.

Figure 10:
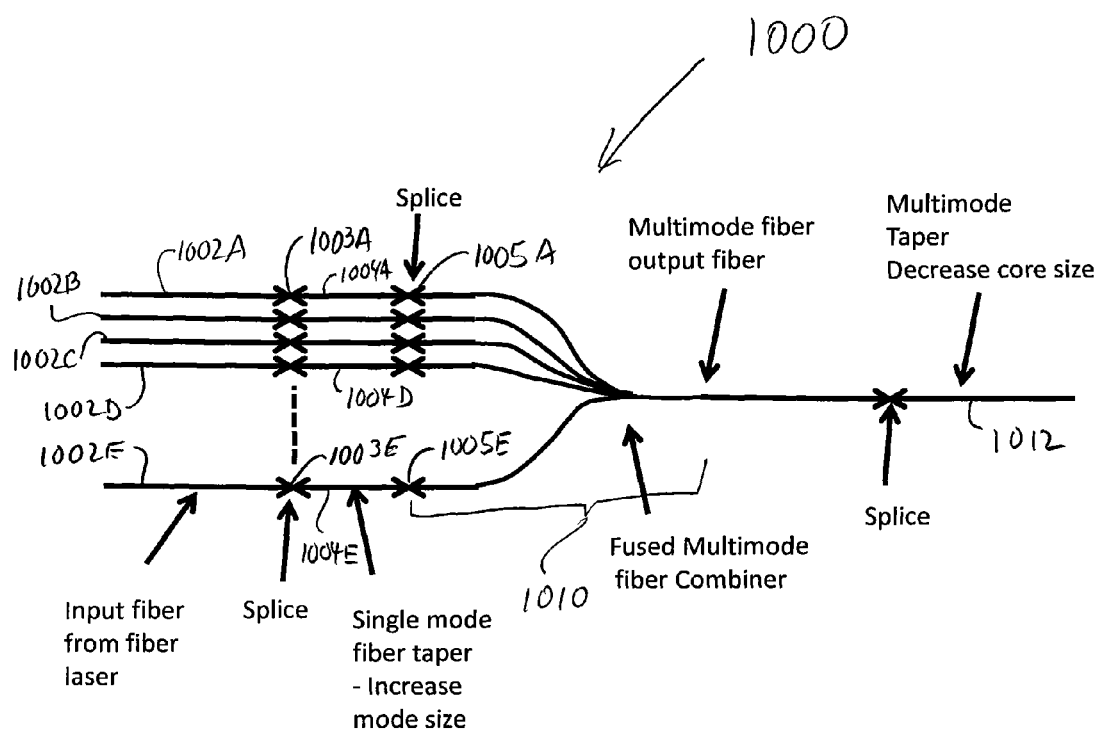
FIG. 10 illustrates a beam combiner constructed of discrete components.

With reference to FIG. 10, a discrete beam combining system 1000 includes input fibers 1002A-1002E (from, for example, fiber lasers) that are spliced to respective tapered single mode fibers 1004A-1004E at splices 1003A-1003E. The tapered fibers 1004A-1004E are tapered so as to have an increased mode field diameter at their outputs that are then connected at splices 1005A-1005E to a fused multimode beam combiner 1010. The output of the beam combiner 1010 is then spliced to a multimode tapered fiber 1012 that is tapered to provide a selected output beam diameter and numerical aperture. The system 1000 provides similar functionality to that provided by the fused combiner shown in FIG. 3. In the example of FIG. 10, the beam expansion and beam guiding regions described with reference to FIG. 5 can be provided in different fibers or combinations of fibers.

In one example of a system such as illustrated in FIG. 10, a plurality of 10 μm core single mode fibers with 0.08 NA are spliced to tapered fibers that expand the mode field diameter to 40 μm at 0.02 NA. Seven such tapered fibers can be coupled to a seven input/one output multimode beam combiner having 100 μm diameter fibers. If the fibers in the combiner are fused but not tapered, output beam diameter is 300 μm with a 0.02 NA. Coupling the beam combiner to a tapered multimode fiber with 300 μm input diameter and a 60 μm output diameter produces an output beam of diameter 60 μm and NA of 0.1.

Figure 11:
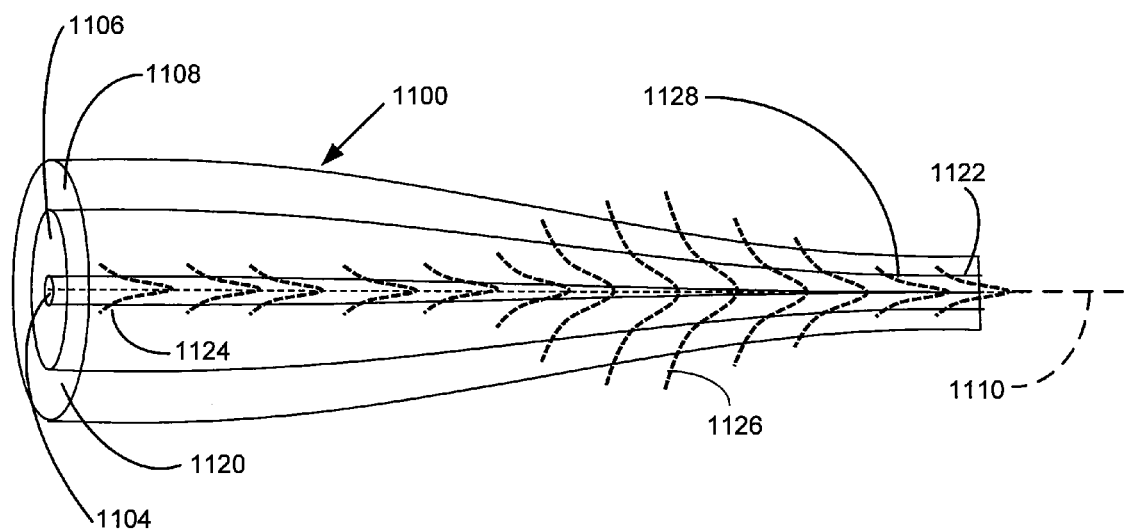
FIG. 11 illustrates mode field diameter expansion in a tapered clad fiber.
Figure 12:
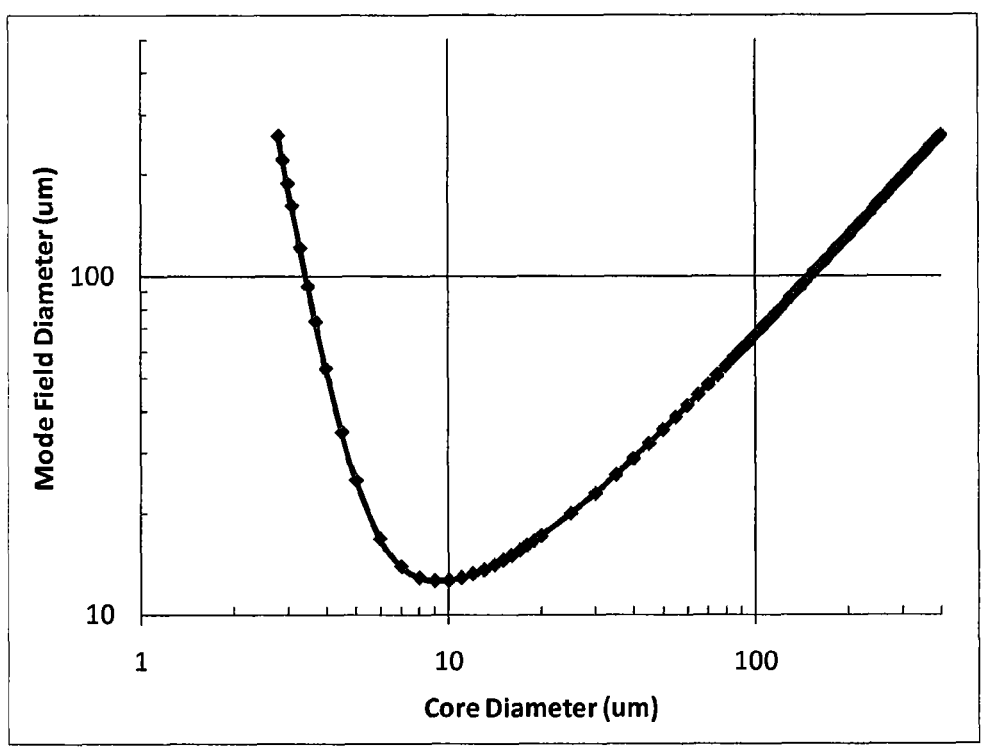
FIG. 12 is a graph of mode field diameter as a function of core diameter for typical core/cladding refractive indices.

As discussed above with reference to FIG. 5, beams in individual input single mode fibers need not be expanded to fill a multimode core defined by an outer cladding layer or ferrule. Instead, the expanded beams can continue to propagate along the cores of the input fibers, and the radiation pattern produced can retain substantial dependence on power distribution in the input fibers. FIGS. 11-12 illustrate the dependence of mode field diameter on fiber core diameter. As shown in FIG. 11, a tapered single mode fiber 1100 includes a core 1104, a first cladding 1106, and a second cladding 1108. The core decreases in diameter along an axis 1110 from an input surface 1120 to an output surface 1122. A mode field 1124 established by the core 1104 and the first cladding 1106 near the input surface 1120 expands to a mode field 1126 in the first cladding 1106 and the core 1104. As is apparent from FIG. 11, the input mode field diameter increases due to the decrease in core diameter. As the core 1104 becomes, very small, a mode field 1128 is defined by the first cladding 1106 (acting as a core) and the second cladding 1108.

FIG. 12 is a graph of mode field diameter as a function of core diameter. For a fiber having a nominal mode field diameter of about 12 μm and a core diameter of about 10 μm, decreases in core diameter can produce slight decreases (or perhaps no decrease) in mode field diameter. However, for decreases of 1-2 μm or more, mode field diameter increases rapidly. The smaller core is unable to confine optical radiation as effectively, and the core/cladding refractive index difference that confines optical radiation is unable to compensate for the beam divergence produced by diffraction as the core becomes smaller. For increasing core size, the light remains guided by the core but with increasing core size the core may support increasing number of modes. With careful launching of the light into a fiber, only a single mode may be propagating.

Figure 13A:
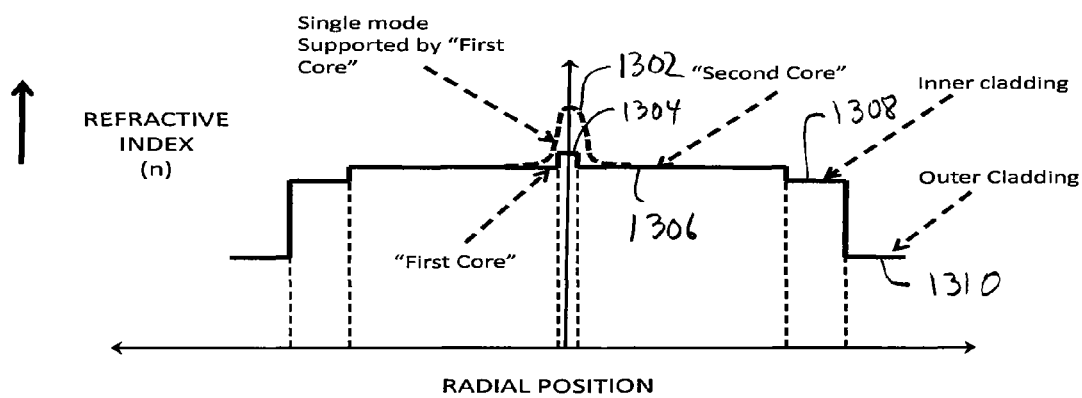
FIGS. 13A-13B are graphs of refractive index and optical modes as a function of radial coordinate before and after tapering, respectively.
Figure 13B:
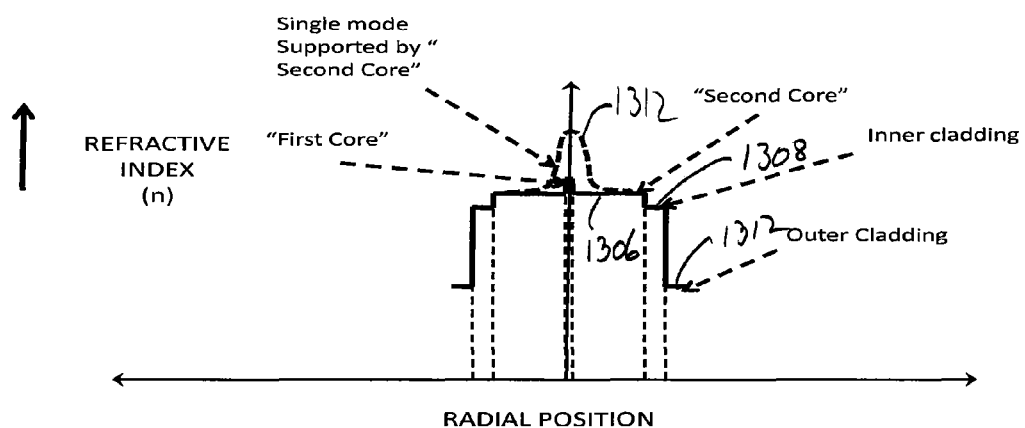

FIGS. 13A-13B are graphs of refractive index as a function of radial coordinate for a representative dual core fiber before and after tapering. Referring to FIG. 13A, an initial single mode 1302 is defined by a first core refractive index 1304 and a second core refractive index 1306 (a cladding for the first core). A refractive index difference between the second core refractive index 1306 and an inner cladding refractive index 1308 is about the same as the first core/second core refractive index difference so that both interfaces are associated with a common numerical aperture. An optional outer cladding 1310 provides a larger refractive index difference so as to confine pump radiation in the inner cladding. Typically, the index difference between the inner and outer claddings is as large as possible and can provide numerical apertures of at least about 0.4. Before tapering, the single mode 1302 is confined to a volume associated with the first core, but actual mode field geometry depends on both wavelength and refractive indices of the first core and the second core. Dimensions of the second core can be selected so that after tapering, the second core and the inner cladding form a single mode waveguide. For example, the first and second cores can have diameters of 10 μm and 50 μm, respectively.

After tapering, the refractive indices of the first and second cores and the inner and outer claddings do not change, but fiber dimensions are reduced. The first core is reduced in size so that it can provide little or very weak guiding, and an expanded mode 1312 fills the second core. Preferably, dimensions of the second core are selected so that mode field diameter is at or near a minimum after tapering (i.e., at or near a minimum such as that shown in FIG. 12.) In one example, first and second cores of diameter 10 μm and 50 μm, respectively, are provided in a dual core fiber that is stretched by a factor of 5. The first core then has a diameter of 2 μm and provides only weak waveguiding. As shown in FIG. 12, such a core has a mode field diameter in the range of 100-200 μm so that radiation associated with a mode of the first core propagates outside the first core and is not well confined. The second core diameter is reduced to 10 μm and is strongly guiding. In this way, a single mode beam based on the initial 10 μm first core becomes a single mode in the stretched second core. Additional cores can be similarly provided, and tapering operations can be selected so that the additional cores are suitably reduced in diameter to define well confined single mode waveguides.

Figure 14A:
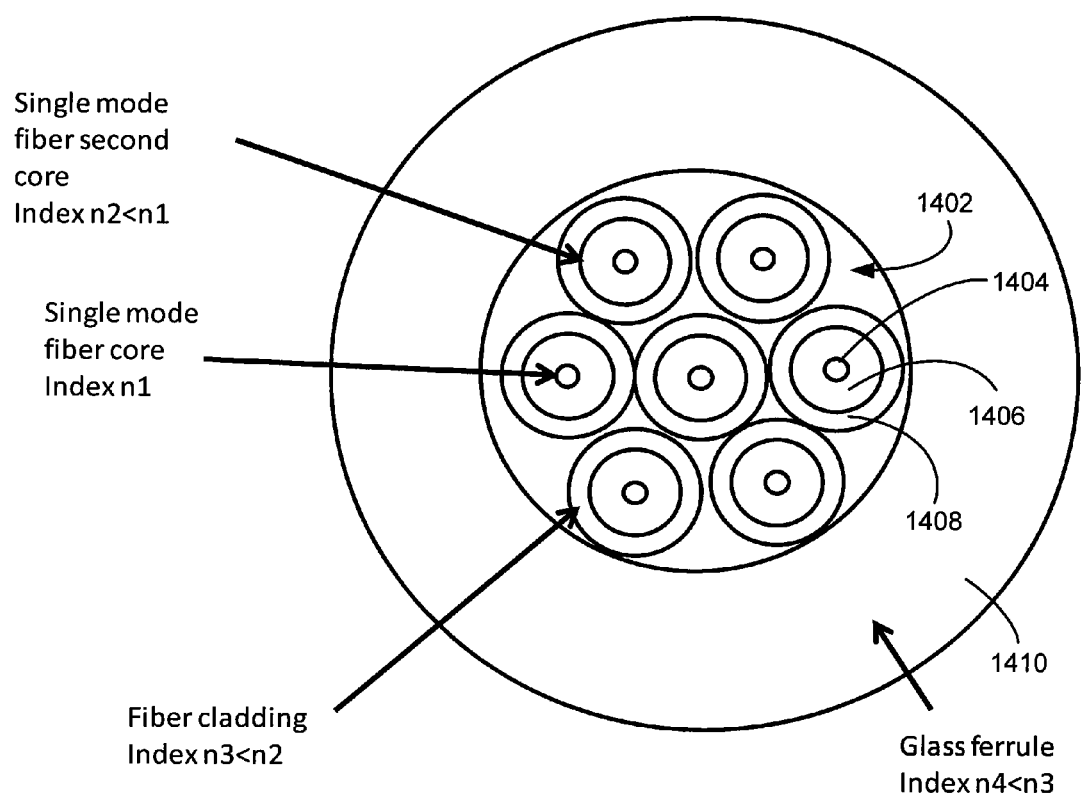
FIG. 14A is a sectional view of a plurality of dual core fibers inserted into a glass ferrule.
Figure 14B:
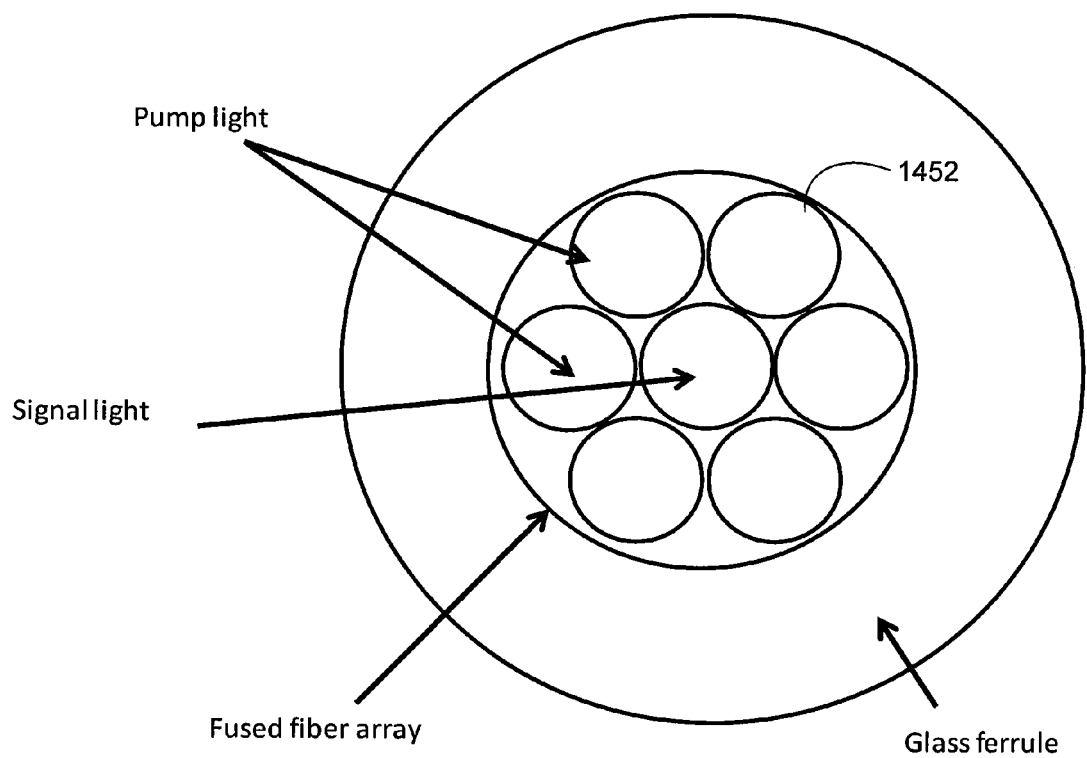
FIG. 14B illustrates mode field diameters after fusing and tapering of the assembly of FIG. 14A.

An example of a beam combiner based on dual core fibers is illustrated in FIGS. 14A-14B. A dual core fiber 1402 has first and second cores 1404, 1406 having refractive indices $n_1, n_2$, wherein $n_2 < n_1$. The fiber 1402 also has a cladding 1408 of refractive index $n_3 < n_2$. The dual core fiber 1402 and other fibers (typically similar or identical in construction to the fiber 1402) are confined by a glass ferrule 1410 that serves as an outer cladding of refractive index $n_4$, wherein $n_4 < n_3$. Typically, a fusing operation is used to taper and stretch the assembly of FIG. 14A, and gaps between fibers are eliminated or substantially reduced in size.

FIG. 14B illustrates mode fields after stretching the assembly of FIG. 14A. Mode fields substantially fill cross-sectional areas defined by the fiber 1402 and other fibers. For example, a mode field 1452 has substantially the same cross-section as the stretched fiber 1402. For example, a fiber can have first and second core diameters of 10 μm and 80 μm and a cladding diameter of 100 μm prior to stretching. An array of seven such fibers could be packed in a glass ferrule having a 300 μm inner diameter prior to stretching. After tapering by a factor of 6, the first core is too small to produce a suitably confined mode, and the second core of about 14 μm diameter provides a confined single mode in conjunction with the inner cladding. Thus the second core (originally serving as a cladding for the first core) defines a mode that substantially fills the second core.

Figure 15:
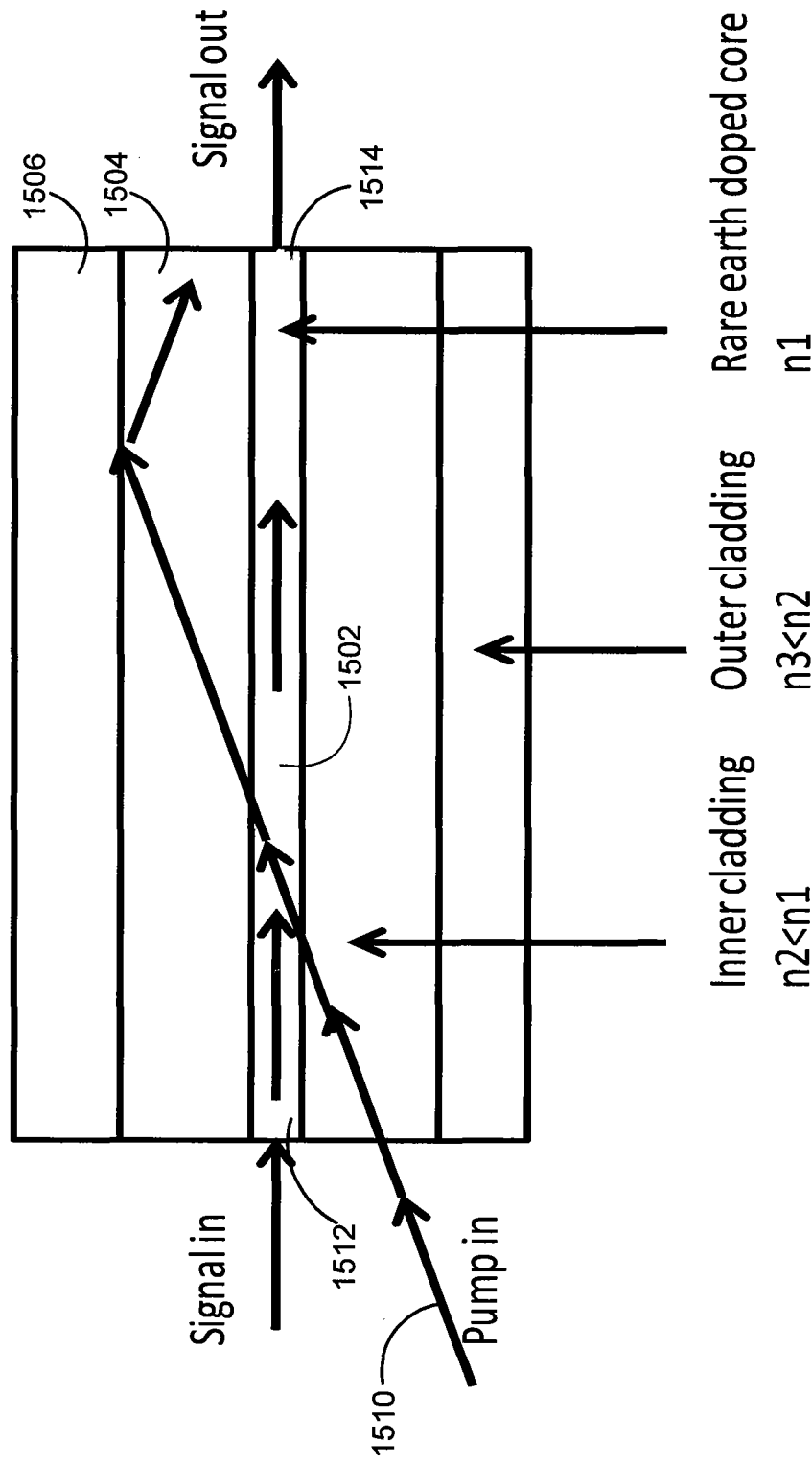
FIG. 15 illustrates a double clad fiber amplifier.

An arrangement for pumping a single mode core for amplification of an optical signal is shown in FIG. 15. A core 1502, which may be rare earth doped, an inner cladding 1504, and an outer cladding 1506 are provided and have refractive indices $n_1, n_2, n_3$, respectively, wherein $n_1 > n_2$ and $n_3 < n_2$. As shown in FIG. 15, pump radiation propagating along a direction 1510 intersects the core 1502 to provide optical gain in the core 1502 and is confined by the outer cladding/inner cladding interface. Signal radiation is applied to an input surface 1512 of the core 1502 and amplified signal radiation is provided at an exit surface 1514. Rare earth dopants such as Er and Yb can be provided in the core 1502.

Figure 16:
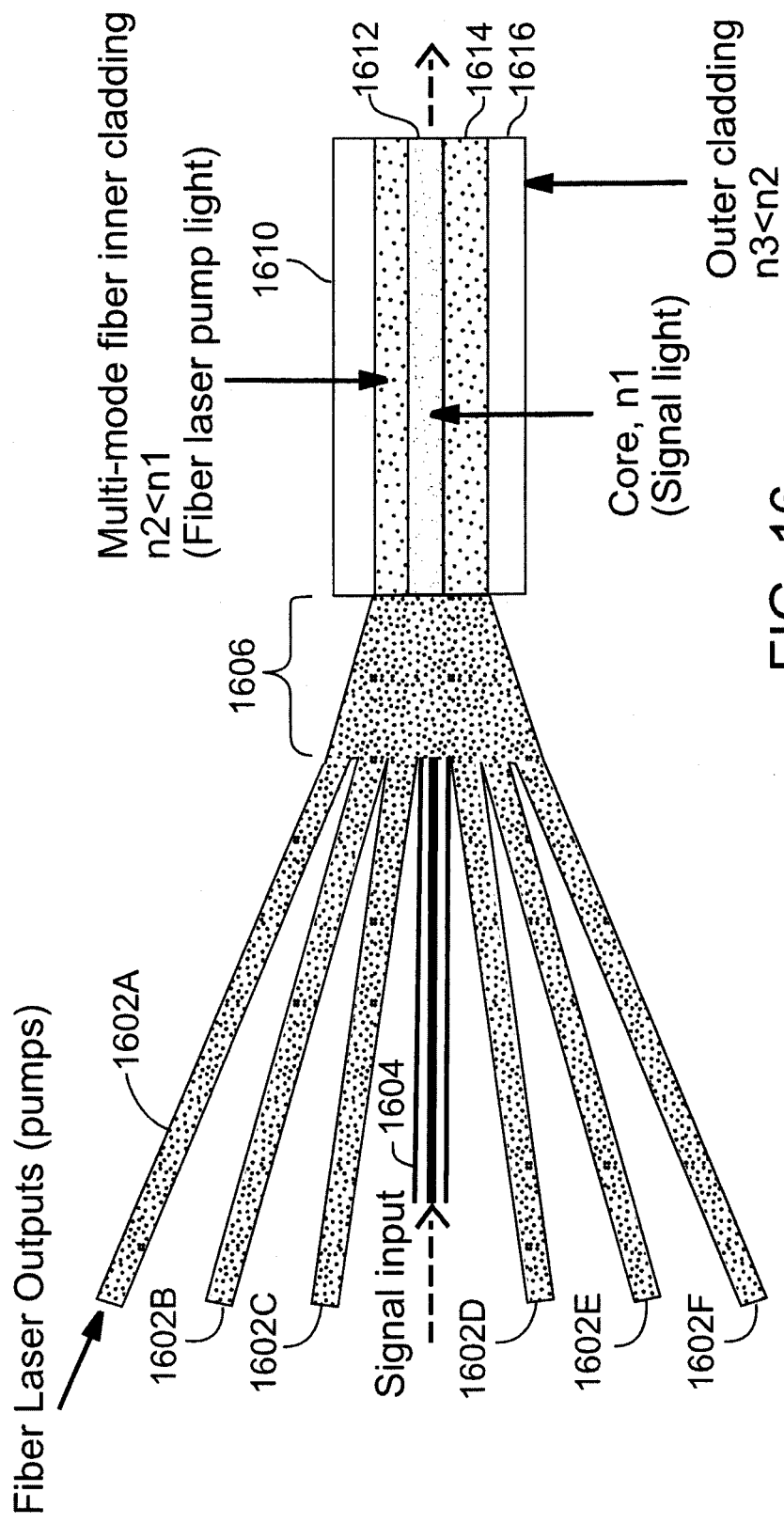
FIG. 16 illustrates a beam combiner situated to pump a double clad fiber amplifier.

Use of a beam combiner to pump a double core fiber amplifier is illustrated in FIG. 16. Fiber laser pump radiation is coupled to input single mode fibers 1602A-1602F and an optical signal to be amplified is coupled to a single mode fiber 1604. A beam combiner 1606 is coupled to these fibers (or the fibers are used to form a beam combiner) to receive the pump radiation and the signal. A double clad fiber 1610 is coupled to the beam combiner 1606 and includes a single mode core 1612, an inner cladding 1614, and an outer cladding 1616. Pump radiation is directed into the inner cladding 1614 and signal radiation is directed into the core 1612 by the beam combiner 1606.

Figure 17A:
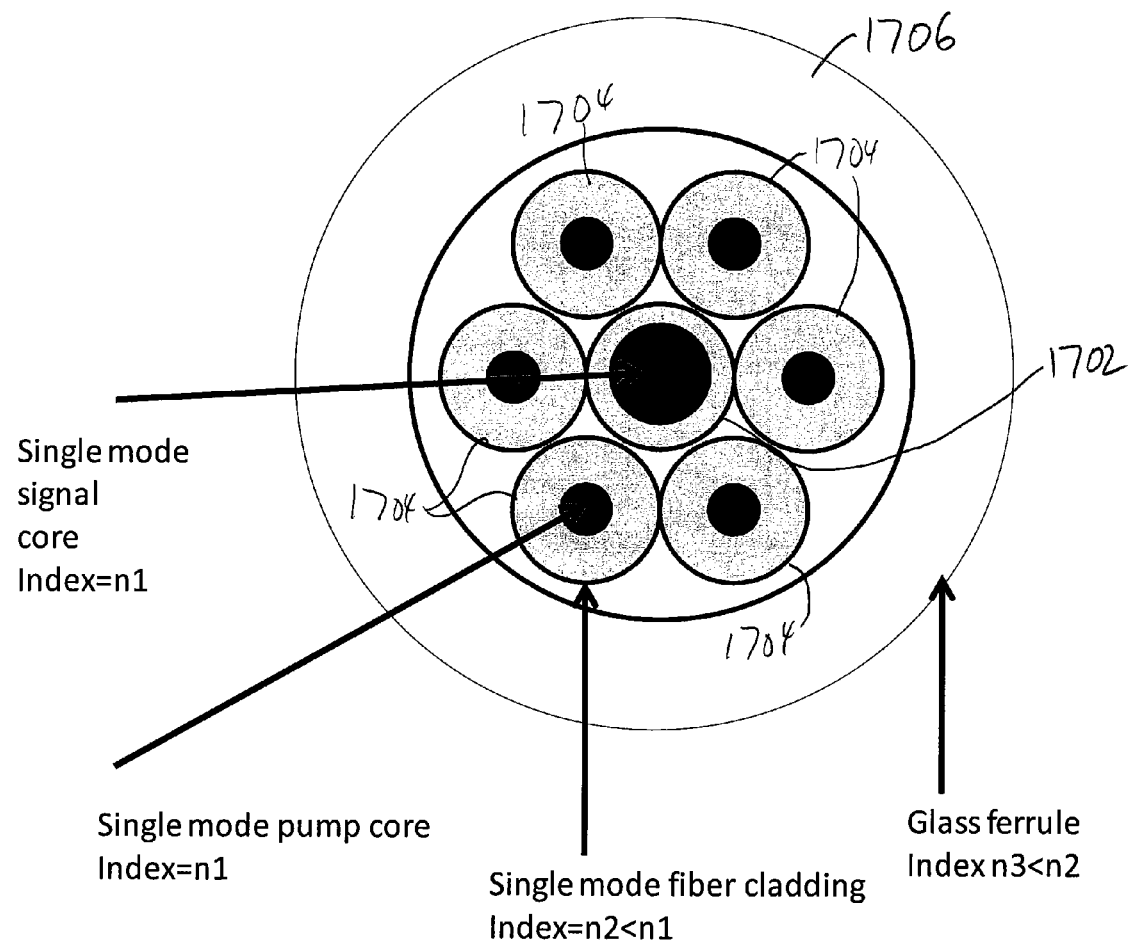
FIG. 17A is a sectional view of a plurality of pump fibers inserted into a glass ferrule and situated around a central signal fiber.
Figure 17B:
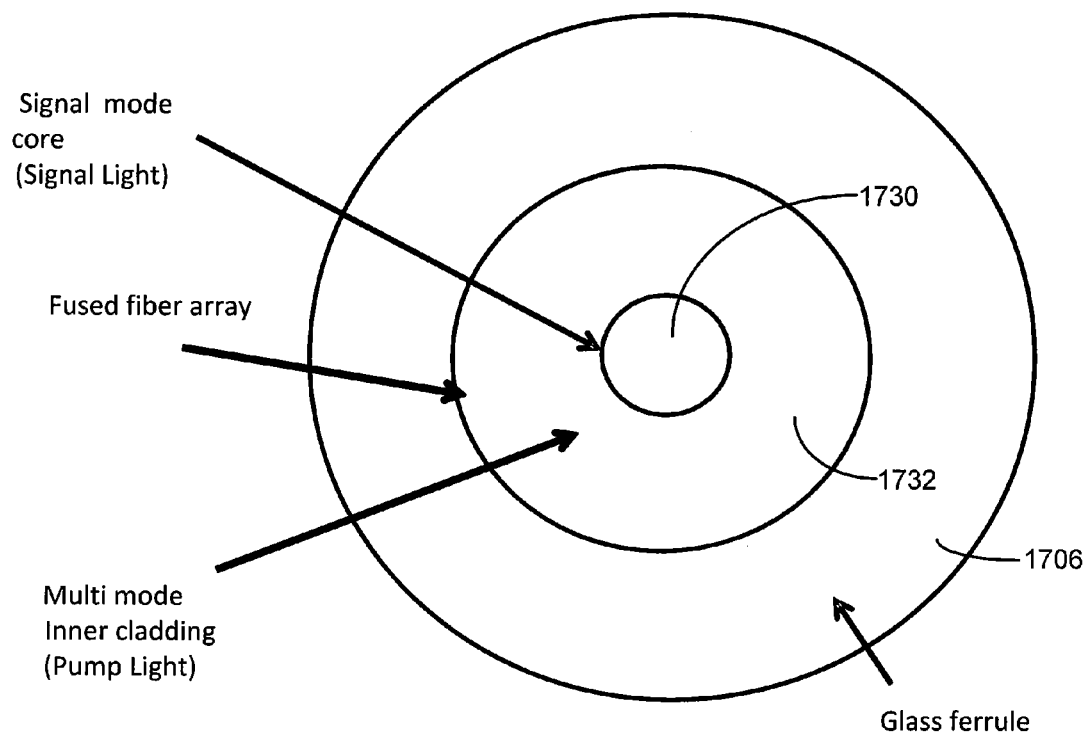
FIG. 17B illustrates mode field diameters after fusing and tapering of the assembly of FIG. 17A.
Figure 18:
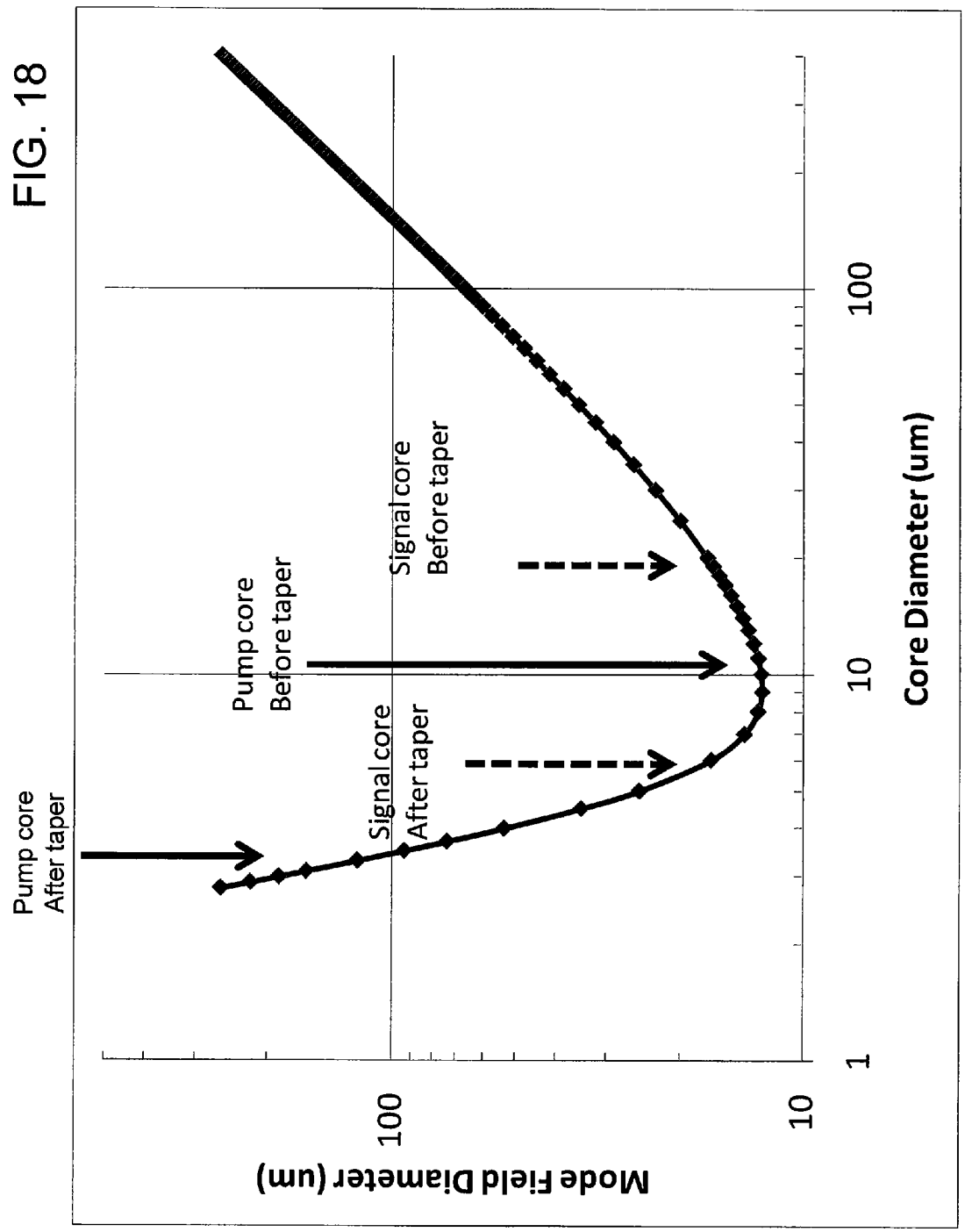
FIG. 18 is a graph of mode field diameter as a function core diameter illustrating mode field diameter changes associated with FIG. 17A.

FIGS. 17A-17B are sectional views of a pump/signal combiner based on a central rare earth doped large core fiber 1702 (the signal fiber) and smaller core single mode fibers 1704 (pump fibers) that are situated within a glass ferrule 1706. FIG. 17A illustrates the assembly prior to fusion and tapering while FIG. 17B illustrates the assembly after fusion and tapering. FIG. 18 is a graph of mode field diameter as a function of core diameter indicating core diameters before and after tapering. Prior to tapering, the pump cores are associated with nearly minimum mode field diameters; after tapering, the mode field diameters are substantially increased so that the pump modes are no longer well confined and are available to pump the signal core. The signal core fiber has a larger mode field diameter prior to tapering, and after tapering, the mode field diameter is larger than the minimum, but is still associated with a relatively well confined mode so that signal radiation remains well guided. As shown in FIG. 17B, signal light remains confined in a central mode 1730 while pump radiation is spread throughout an inner cladding region 1732 established by fused claddings of the pump fibers.

Figure 19:
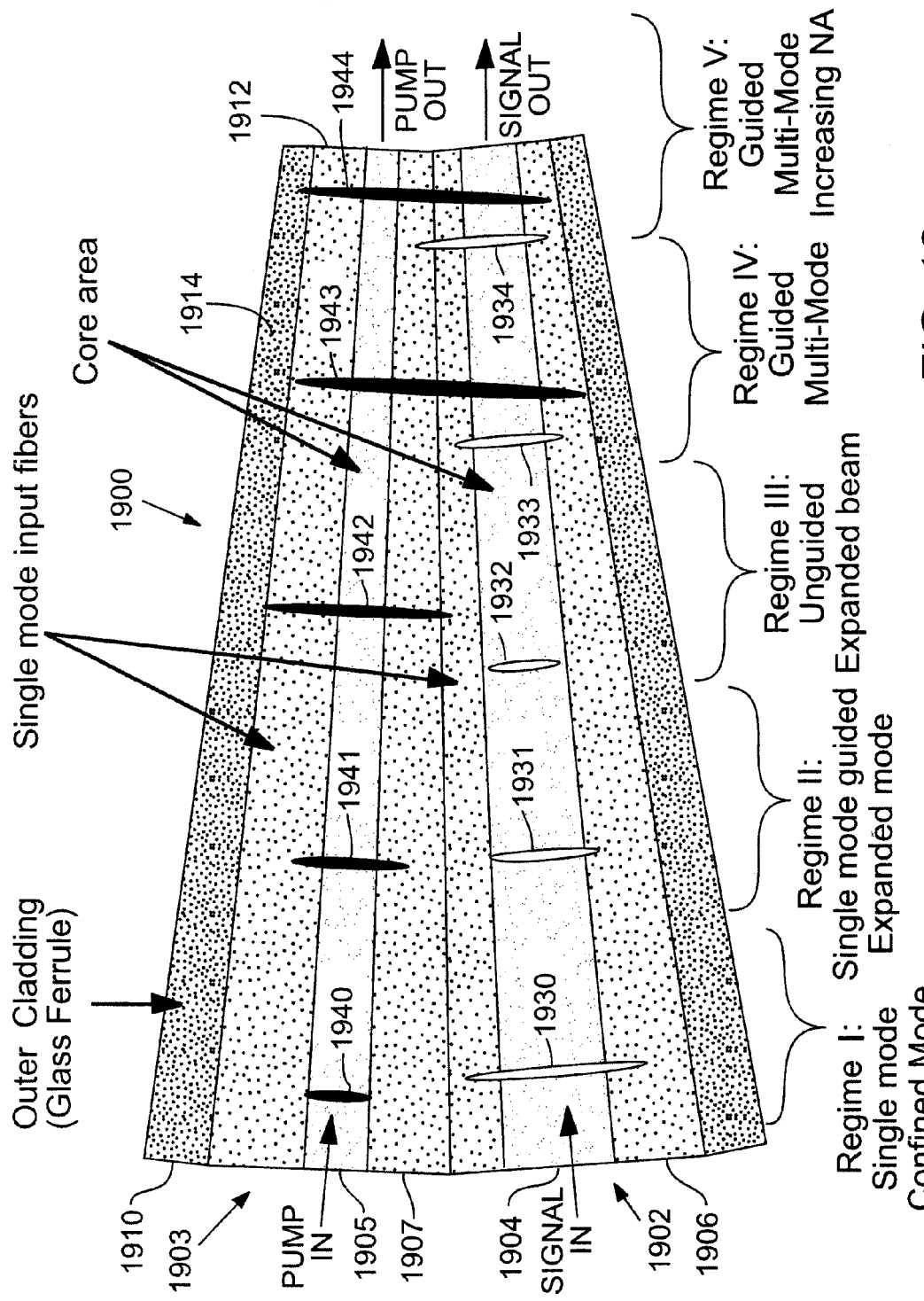
FIG. 19 illustrates mode size expansion in a tapered single mode beam combiner in which a signal mode remains confined to a signal fiber.

A representative portion of a tapered region of a fused pump/signal combiner 1900 is illustrated in FIG. 19. For convenient illustration, only two tapered fibers are shown, but more than two can be used, and typically additional pump fibers are provided. A signal fiber 1902 and a pump fiber 1903 include respective cores 1904, 1905 and claddings 1906, 1907 and are tapered so as to have decreasing cross-sectional areas from an input end 1910 to an output end 1912. Typically the claddings 1906, 1907 are in contact with each other. An optional glass ferrule 1914 is in contact with one or more of the claddings and serves as an outer cladding of a multimode waveguide formed by fusion of the pump fiber 1903 and other pump fibers and the glass ferrule 1914. The signal fiber 1902 is configured so that as a first core tapers, the light in the core remains guided by the core. At the output surface, signal radiation propagates in a single mode waveguide formed by the core 1902. Mode field diameters 1930-1934 of the signal fiber single modes (lowest order) vary along the taper while beam cross-sectional areas 1940-1944 of the pump (not necessarily single mode beams) increase to fill the taper and then decrease to provide a suitable output diameter and numerical aperture. Alternatively the core 1902 may be a double core as shown in FIG. 11 and FIGS. 13A-13B. Propagation in the pump fiber is as described above with reference to FIG. 5

Figure 20A:
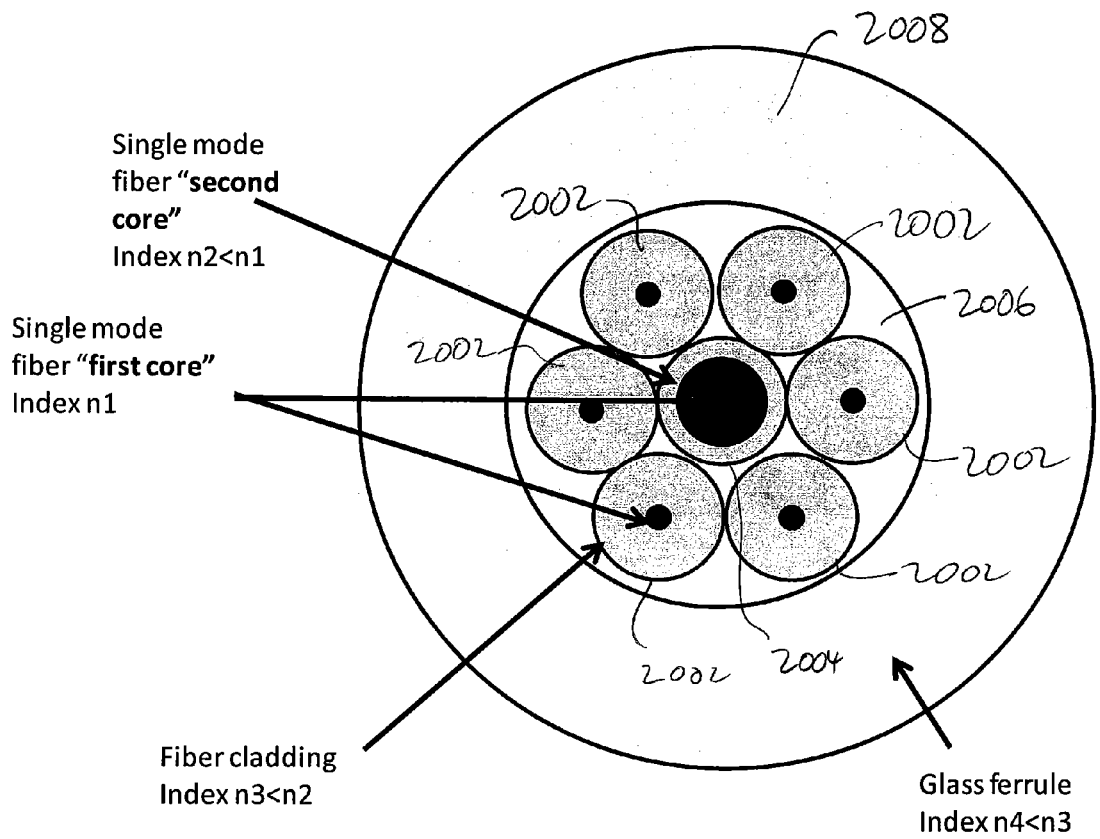
FIG. 20A is a sectional view of a plurality of pump fibers inserted into a glass ferrule and situated around a central double core signal fiber.
Figure 20B:
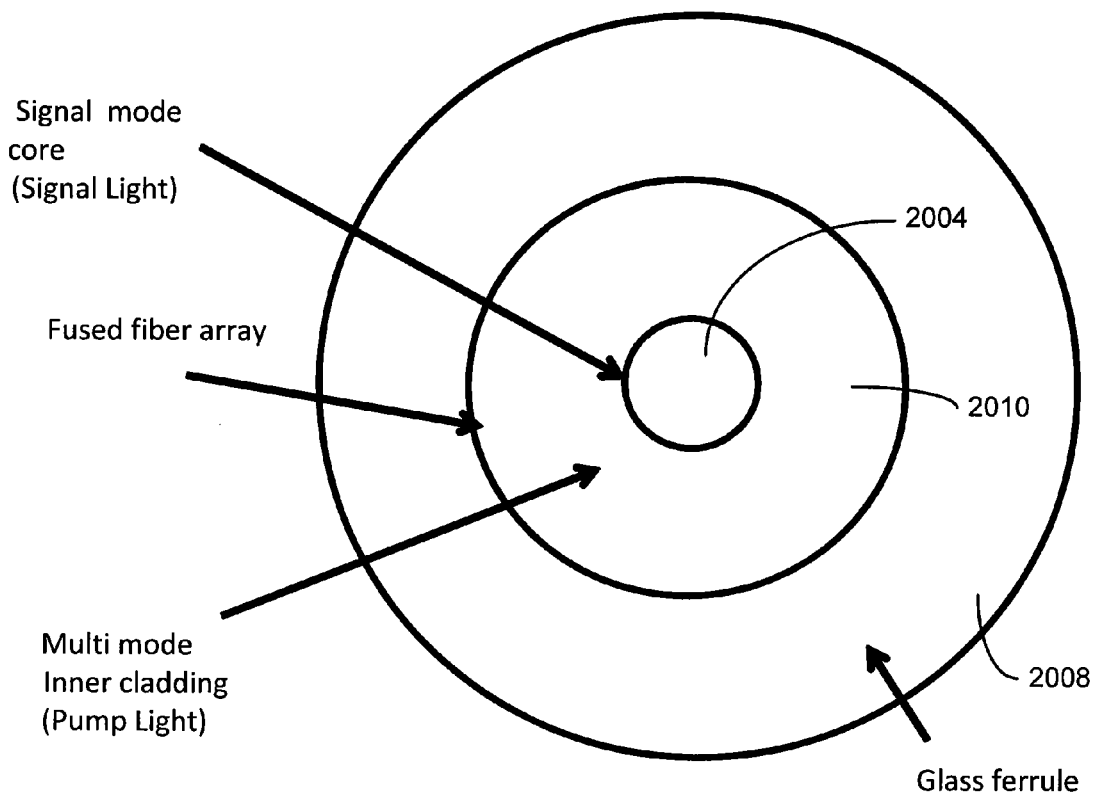
FIG. 20B illustrates mode field diameters after fusing and tapering of the assembly of FIG. 20A.

Another representative tapered pump/signal combiner is shown in FIGS. 20A-20B. With reference to FIG. 20A, prior to tapering and fusing, the combiner includes single mode pump fibers 2002 and a central signal fiber 2004. The fibers 2002, 2004 extend through a glass ferrule selected to form an outer cladding. The fibers 2002 have signal mode cores of refractive index $n_1$ and claddings of refractive index $n_3$. The central fiber has a first core and a second core having refractive indices of $n_1$ and $n_2$, respectively, and the glass ferrule has a refractive index of $n_4$. Generally, $n_1 > n_2$, $n_3 < n_2$, and $n_4 < n_3$. After fusing and tapering, the pump fibers 2002 form a multimode pump fiber that fills an inner cladding 2010 and a signal mode fills the tapered central fiber 2004.

Figure 21:
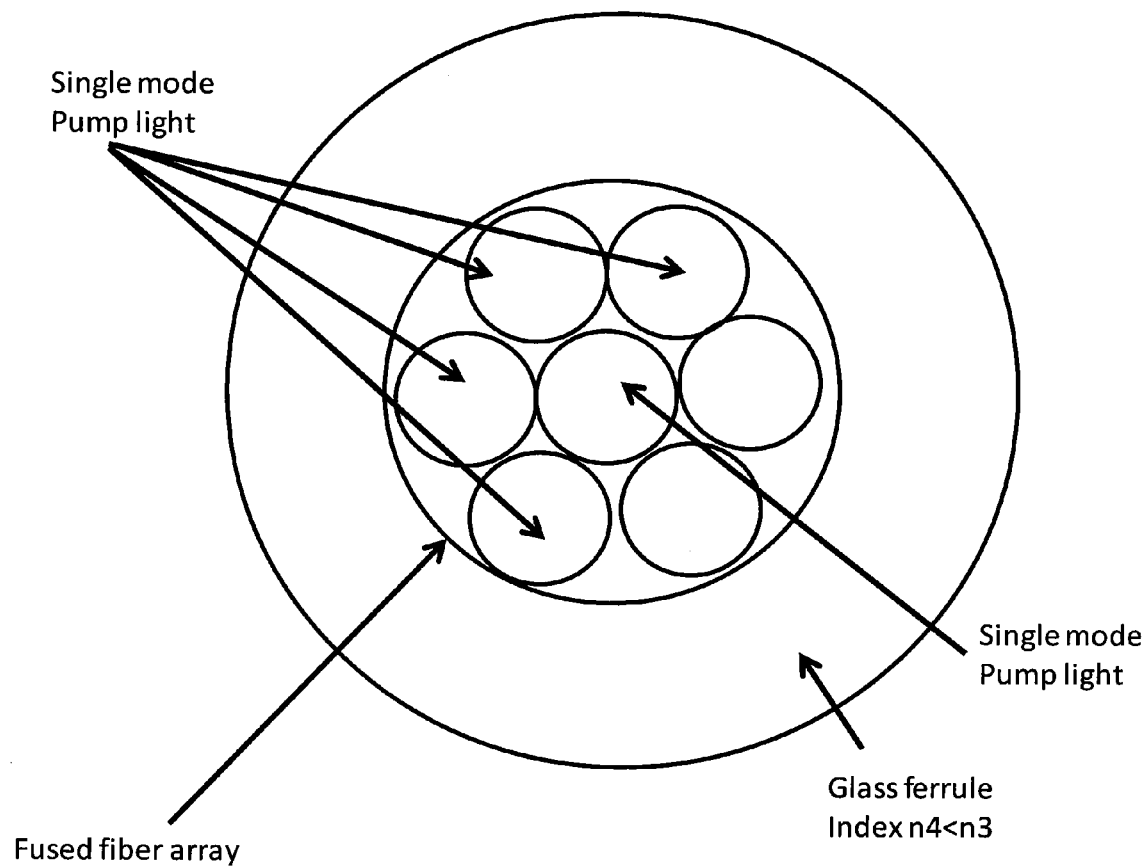
FIG. 21 illustrates an array of double core fibers situated in a glass ferrule and fused and tapered.

In yet another example, FIG. 21 illustrates an array of double core fibers situated in a glass ferrule and fused and tapered.

In another example, improved overlap between pump and signal modes can be provided based on a central signal fiber surrounded by low index cladding pump fibers, which are in turn surrounded by a still lower index glass ferrule. Improved overlap can minimize or reduce the required length of pumped fiber to produce sufficient gain for some applications, and can reduce undesirable non-linear effects such as stimulated Brillouin scattering (SBS). A refractive index profile for such a "triple core" structure is shown in FIGS. 22A-22C, with no taper (FIG. 22A), an intermediate taper (FIG. 22B) and after tapering (FIG. 22C), respectively.

Figure 22A:
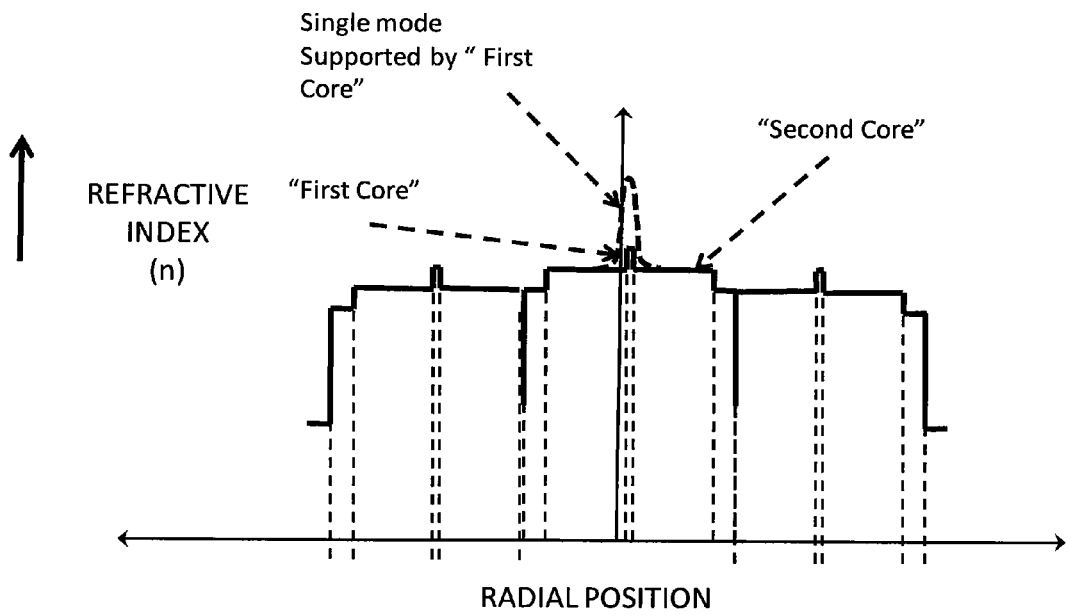
FIGS. 22A-22C are graphs of refractive index as a function of radial coordinate for a "triple core" fiber with no taper, an intermediate taper, and a final taper, respectively.
Figure 22B:
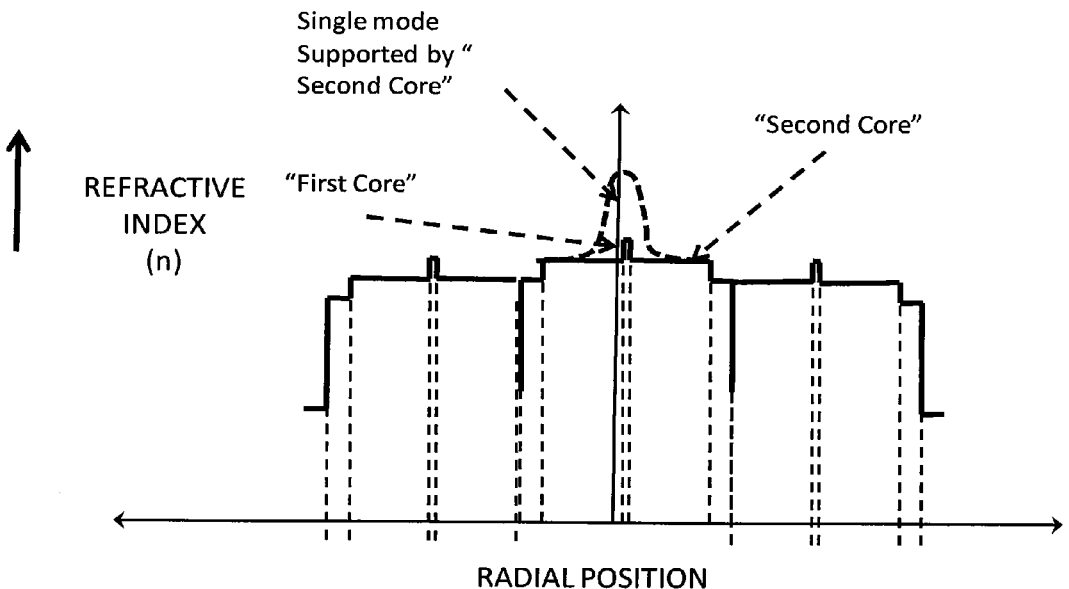
Figure 22C:
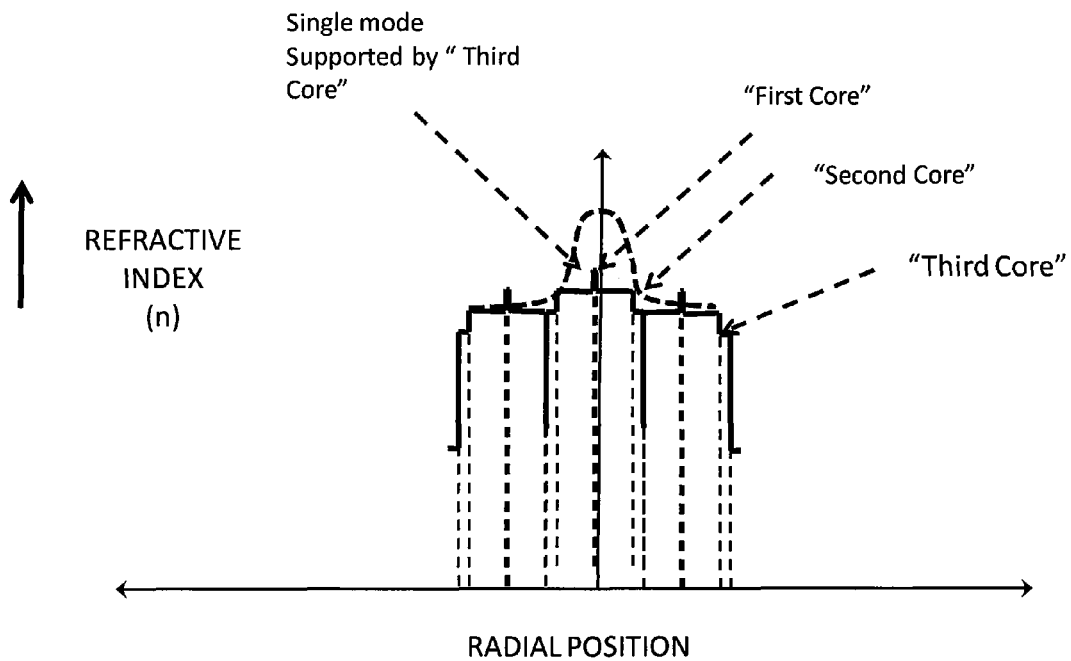
Figure 22D:
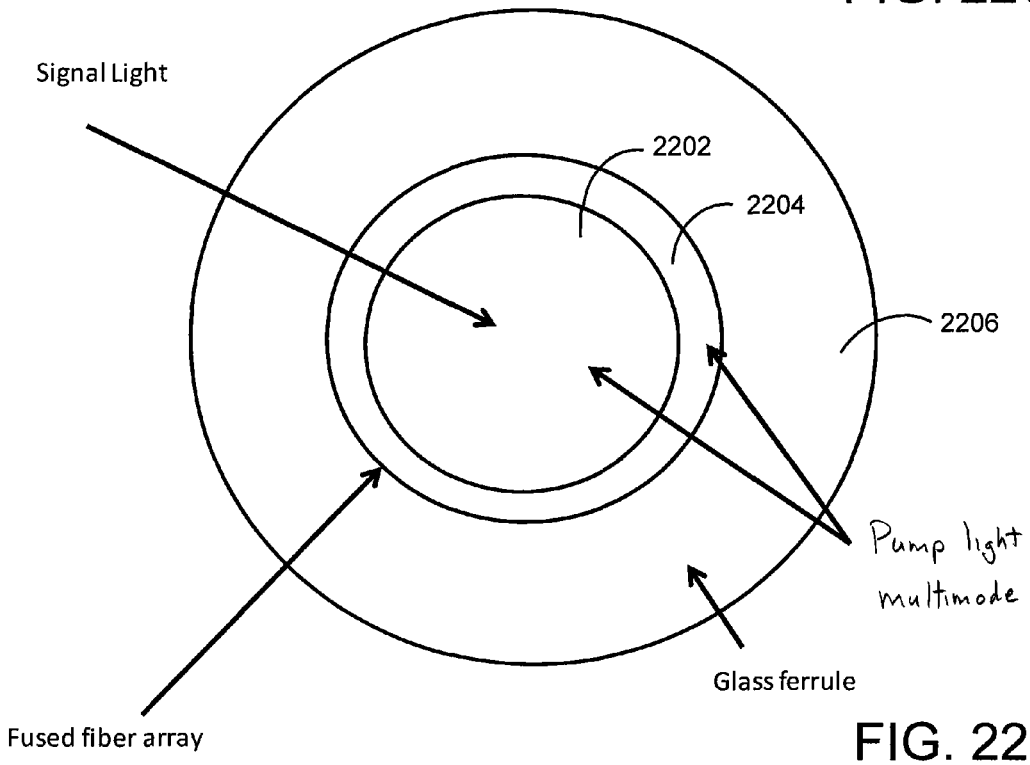
FIG. 22D illustrates overlap of a signal mode with pump modes using a tapered triple core fiber.

As shown in FIG. 22A, a single mode is supported by a first core and a second core. Upon tapering, this single mode expands and is coupled so a single mode defined by the second core and a third core is as shown in FIG. 22B. After additional tapering, a final single mode is defined by the second core and the third core. The final single mode is substantially larger than the single mode defined by the first and second cores. Pump radiation propagates in a multimode fiber which is defined by a glass ferrule and the fused fibers interior to the ferrule. FIG. 22D illustrates a central single mode 2202 and a multimode pump light power distribution 2204 that extends to a glass ferrule 2206.

The above embodiments are representative examples only, and we claim all that is encompassed by the appended claims and the equivalents thereto.

We claim:

1. A tapered coupler, comprising a plurality of tapered, fused single mode fibers enclosed in a glass ferrule, the fibers tapered by a factor of at least 2 from a tapered coupler larger end having a first cross-sectional area to a tapered coupler smaller end having a second cross-sectional area smaller than the first cross-sectional area, wherein at least one of the tapered single mode fibers includes at least a first core and a second core surrounding the first core at the tapered coupler smaller end, the first core defining a single-mode waveguide mode at the tapered coupler larger end that expands to become guided by the second core at the smaller end of the tapered coupler and the second core defining a confined single-mode or few-mode waveguide mode at the smaller end of the tapered coupler.

2. The tapered coupler of claim 1, wherein the fibers are tapered by between a factor of 5 and 10.

3. An optical amplifier, comprising:
  a tapered coupler according to claim 1 wherein the plurality of tapered, fused single mode fibers includes at least one pump fiber defining at least a portion of a multimode core at the tapered coupler smaller end; and
  a rare earth doped fiber optically coupled to an output of the tapered coupler smaller end and operable to provide optical gain in response to pump radiation from at least one tapered pump fiber.

4. The optical amplifier of claim 3, further comprising an outer cladding having a refractive index that is less than a refractive index of pump fiber claddings.

5. A beam combiner, comprising:
  two or more few mode optical fibers having respective tapered portions that are situated so as to define a fused and tapered fiber bundle comprising a first end having a first cross-sectional area that is at least a factor of two times larger than a second cross-sectional area of a second end of the fiber bundle, wherein the fused and tapered fiber bundle comprises a double core portion including a first core and a second core surrounding the first core, the first core defining a few mode waveguide at the first end and the second core defining a single-mode or few-mode waveguide mode at the second end.

6. The beam combiner of claim 5, wherein at least a first fiber of the optical fibers is a signal fiber situated to conduct an optical input signal, and at least a second fiber of the optical fibers is a pump fiber situated to conduct a pump radiation signal for amplifying the optical input signal.

7. The beam combiner of claim 5, wherein the tapered portions are tapered so that a lowest order mode of each of the few mode optical fibers is substantially unguided by respective few mode optical fiber cores.

8. The beam combiner of claim 5, wherein the tapered portions are tapered so that a lowest order mode of the few mode optical fibers is expanded so as to substantially occupy a cross-sectional area of the tapered fiber bundle.

9. The beam combiner of claim 5, wherein the few mode optical fibers have V-numbers of less than 5.

10. The beam combiner of claim 5, wherein input surfaces of the two or more few mode fibers are situated on flexibly separable fiber portions.

11. The beam combiner of claim 5, further comprising a tapered combiner cladding in optical contact with and surrounding the fiber bundle, the tapered combiner cladding having a refractive index that is less than a refractive index of fiber claddings surrounding the few mode optical fibers.

12. The beam combiner of claim 11, wherein the tapered portions of each of the few mode optical fibers are fused to form the fiber bundle so that the fused fibers and the combiner cladding form a multimode optical waveguide.

13. The beam combiner of claim 12, wherein the tapered portions are configured so that a lowest order mode of the few mode optical fibers is expanded so as to substantially fill the second core of the fused fiber bundle.

14. The beam combiner of claim 5, wherein the tapered fiber bundle has an output surface, and further comprising a guide fiber extending through the fiber bundle to the output surface.

15. The beam combiner of claim 5, wherein the second core defines a single mode waveguide.

16. The beam combiner of claim 5, wherein the second core defines a few mode waveguide.

17. The beam combiner of claim 16, wherein the double core portion is a most central fiber in the tapered fiber bundle.

18. The beam combiner of claim 5, further comprising a signal fiber having a corresponding tapered portion in the tapered fiber bundle, wherein the signal fiber is configured to be a few mode optical fiber in the tapered portion.

19. A fiber assembly, comprising:
a beam combiner as recited in claim 5; and
an output fiber optically coupled to an output surface of the beam combiner.

20. The fiber assembly of claim 19, wherein the output fiber is a double clad fiber having a core and an inner cladding, wherein the beam combiner is configured to optically couple at least one of the two or more few mode optical fibers and the inner cladding.

21. The fiber assembly of claim 20, wherein the two or few mode optical fibers of the beam combiner includes a signal fiber that is optically coupled to the core of the double clad fiber.

22. The fiber assembly of claim 21, wherein a mode field diameter of a lowest order mode of the tapered signal fiber is substantially the same as a mode field diameter associated with the double clad fiber core.

23. The fiber assembly of claim 21, wherein the signal fiber is a double core fiber that is tapered in the fused and tapered fiber bundle so that a lowest order mode associated with a first core of the double core fiber corresponds to the first core of the double core portion of the fused and tapered fiber bundle and expands so as to substantially fill a second core of the double core fiber that corresponds to the second core of the double core portion of the fused and tapered fiber bundle.

24. The fiber assembly of claim 23, wherein the at least one of the two or more few mode optical fibers coupled to the inner cladding of the output fiber have claddings having refractive indices that are less than a refractive index of the second core of the double core signal fiber so that the few mode optical fibers are optically coupled to the second core.

25. The fiber assembly of claim 19, further comprising a plurality of radiation sources coupled to corresponding few mode optical fibers.

26. The fiber assembly of claim 19, wherein the few mode optical fibers are single mode fibers.

27. An illuminator, comprising:
a plurality of input optical fibers; and
a beam combiner according to claim 5 having an input coupled to the input optical fibers and an output configured to deliver a combined beam.

28. The illuminator of claim 27, further comprising an outer cladding situated about the second end of the double core portion so as to define a multimode waveguide.

29. The illuminator of claim 27, further comprising lasers coupled to the input optical fibers.

30. The illuminator of claim 27, wherein the lasers are laser diodes or fiber lasers.

31. The illuminator of claim 27, wherein the input optical fibers are single mode optical fibers and have mode field diameters of between about 5 µm and 15 µm.

32. The illuminator of claim 31, wherein the taper is at least 5.

33. The illuminator of claim 27, further comprising an output multimode fiber optically coupled to the second end of the double core portion.

* * * * *